(12) United States Patent
Nakamura et al.

(10) Patent No.: US 7,141,822 B2
(45) Date of Patent: Nov. 28, 2006

(54) SEMICONDUCTOR DEVICE AND METHOD FOR MANUFACTURING THE SAME

(75) Inventors: Osamu Nakamura, Kanagawa (JP); Masayuki Kajiwara, Kanagawa (JP); Junichi Koezuka, Kanagawa (JP); Shunpei Yamazaki, Tokyo (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 18 days.

(21) Appl. No.: 10/066,542

(22) Filed: Feb. 5, 2002

(65) Prior Publication Data
US 2002/0125480 A1 Sep. 12, 2002

(30) Foreign Application Priority Data
Feb. 9, 2001 (JP) .............................. 2001-034294

(51) Int. Cl.
*H01L 29/786* (2006.01)
(52) U.S. Cl. .................. 257/72; 257/913; 257/E29.299
(58) Field of Classification Search .................. 257/72, 257/913, E29.299
See application file for complete search history.

(56) References Cited

U.S. PATENT DOCUMENTS

| | | |
|---|---|---|
| 3,535,775 A | 10/1970 | Garfinkel et al. |
| 4,371,403 A | 2/1983 | Ikubo et al. |
| 4,477,308 A | 10/1984 | Gibson et al. |
| 4,534,820 A | 8/1985 | Mori et al. |
| 4,727,044 A | 2/1988 | Yamazaki |
| 5,244,819 A | 9/1993 | Yue |
| 5,248,630 A | 9/1993 | Serikawa et al. |
| 5,275,896 A | 1/1994 | Garofalo et al. |
| 5,318,661 A | 6/1994 | Kumomi |
| 5,346,833 A * | 9/1994 | Wu .............................. 438/30 |
| 5,399,883 A | 3/1995 | Baliga |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |

(Continued)

FOREIGN PATENT DOCUMENTS

EP 651431 5/1995

(Continued)

OTHER PUBLICATIONS

Lee et al. *IEEE Transactions on Electron Devices*, vol. 45, No. 8, Aug. 1998 "Argon Ion-Implantation on Polysilicon or Amorphous-Silicon for Boron Penetration Suppression in $p^+$ pMOSFET" p. 1737-1744.

(Continued)

*Primary Examiner*—Jerome Jackson
(74) *Attorney, Agent, or Firm*—Nixon Peabody LLP; Jeffrey L. Costellia

(57) ABSTRACT

The TFT electric characteristic is ready to be influenced by the channel region in the neighborhood of an interface between a semiconductor and a gate insulating film. The present invention provides TFTs reduced in electric characteristic deviations and a method for manufacturing the same. The invention forms a region or layer containing an inactive element, or rear gas element, in the channel region. As shown in FIG. 1, a rear gas element is contained at least in an upper layer of the channel region.

38 Claims, 18 Drawing Sheets

U.S. PATENT DOCUMENTS

| | | |
|---|---|---|
| 5,550,070 A | 8/1996 | Funai et al. |
| 5,551,984 A | 9/1996 | Tanahashi |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,824 A | 4/1998 | Kousai et al. |
| 5,773,327 A | 6/1998 | Yamazaki et al. |
| 5,789,284 A | 8/1998 | Yamazaki et al. |
| 5,814,540 A | 9/1998 | Takemura et al. |
| 5,843,225 A | 12/1998 | Takayama et al. |
| 5,851,860 A | 12/1998 | Makita et al. |
| 5,869,363 A | 2/1999 | Yamazaki et al. |
| 5,888,858 A | 3/1999 | Yamazaki et al. |
| 5,893,730 A | 4/1999 | Yamazaki et al. |
| 5,897,347 A | 4/1999 | Yamazaki et al. |
| 5,915,174 A | 6/1999 | Yamazaki et al. |
| 5,923,962 A | 7/1999 | Ohtani et al. |
| 5,932,893 A | 8/1999 | Miyanaga et al. |
| 5,949,115 A | 9/1999 | Yamazaki et al. |
| 5,956,579 A | 9/1999 | Yamazaki et al. |
| 5,960,252 A | 9/1999 | Matsuki et al. |
| 5,961,743 A | 10/1999 | Yamazaki et al. |
| 5,962,871 A | 10/1999 | Zhang et al. |
| 5,970,327 A | 10/1999 | Makita et al. |
| 5,977,559 A | 11/1999 | Zhang et al. |
| 5,985,740 A | 11/1999 | Yamazaki et al. |
| 5,997,286 A | 12/1999 | Hemsath et al. |
| 5,998,838 A * | 12/1999 | Tanabe et al. ............... 257/347 |
| 6,013,544 A | 1/2000 | Makita et al. |
| 6,015,593 A | 1/2000 | Yonkoski et al. |
| 6,022,458 A | 2/2000 | Ichikawa |
| 6,027,987 A | 2/2000 | Yamazaki et al. |
| 6,048,758 A | 4/2000 | Yamazaki et al. |
| 6,063,654 A | 5/2000 | Ohtani |
| 6,066,518 A | 5/2000 | Yamazaki |
| 6,071,764 A | 6/2000 | Zhang et al. |
| 6,071,766 A | 6/2000 | Yamazaki et al. |
| 6,072,193 A | 6/2000 | Ohnuma et al. |
| 6,077,731 A | 6/2000 | Yamazaki et al. |
| 6,077,758 A | 6/2000 | Zhang et al. |
| 6,083,324 A | 7/2000 | Henley et al. |
| 6,084,247 A | 7/2000 | Yamazaki et al. |
| 6,087,679 A | 7/2000 | Yamazaki et al. |
| 6,093,934 A | 7/2000 | Yamazaki et al. |
| 6,100,562 A | 8/2000 | Yamazaki et al. |
| 6,111,557 A | 8/2000 | Koyama et al. |
| 6,121,660 A | 9/2000 | Yamazaki et al. |
| 6,133,073 A | 10/2000 | Yamazaki et al. |
| 6,133,075 A | 10/2000 | Yamazaki et al. |
| 6,133,119 A | 10/2000 | Yamazaki |
| 6,153,445 A | 11/2000 | Yamazaki et al. |
| 6,156,590 A | 12/2000 | Yamazaki et al. |
| 6,156,628 A | 12/2000 | Ohnuma et al. |
| 6,160,268 A | 12/2000 | Yamazaki |
| 6,162,667 A | 12/2000 | Funai et al. |
| 6,162,704 A | 12/2000 | Yamazaki et al. |
| 6,165,824 A | 12/2000 | Takano et al. |
| 6,168,980 B1 | 1/2001 | Yamazaki et al. |
| 6,168,981 B1 | 1/2001 | Battaglia et al. |
| 6,180,439 B1 | 1/2001 | Yamazaki et al. |
| 6,184,559 B1 | 2/2001 | Hayakawa et al. |
| 6,194,255 B1 | 2/2001 | Hiroki et al. |
| 6,197,624 B1 | 3/2001 | Yamazaki |
| 6,201,585 B1 | 3/2001 | Takano et al. |
| 6,204,101 B1 | 3/2001 | Yamazaki et al. |
| 6,204,154 B1 | 3/2001 | Zhang et al. |
| 6,207,969 B1 | 3/2001 | Yamazaki |
| 6,218,219 B1 | 4/2001 | Yamazaki et al. |
| 6,225,152 B1 | 5/2001 | Yamazaki et al. |
| 6,232,205 B1 | 5/2001 | Ohtani |
| 6,232,621 B1 | 5/2001 | Yamazaki et al. |
| 6,242,290 B1 | 6/2001 | Nakajima et al. |
| 6,251,712 B1 | 6/2001 | Tanaka et al. |
| 6,255,195 B1 | 7/2001 | Linn et al. |
| 6,285,042 B1 | 9/2001 | Ohtani et al. |
| 6,287,900 B1 | 9/2001 | Yamazaki et al. |
| 6,287,988 B1 | 9/2001 | Nagamine et al. |
| 6,291,275 B1 | 9/2001 | Yamazaki et al. |
| 6,294,441 B1 | 9/2001 | Yamazaki |
| 6,300,659 B1 | 10/2001 | Zhang et al. |
| 6,303,415 B1 | 10/2001 | Yamazaki |
| 6,303,963 B1 | 10/2001 | Ohtani et al. |
| 6,306,694 B1 | 10/2001 | Yamazaki et al. |
| 6,307,214 B1 | 10/2001 | Ohtani et al. |
| 6,316,789 B1 | 11/2001 | Yamazaki et al. |
| 6,316,810 B1 | 11/2001 | Yamazaki et al. |
| 6,331,457 B1 | 12/2001 | Yamazaki et al. |
| 6,337,259 B1 | 1/2002 | Ueda et al. |
| 6,346,730 B1 | 2/2002 | Kitakado et al. |
| 6,362,507 B1 | 3/2002 | Ogawa et al. |
| 6,376,336 B1 | 4/2002 | Buynoski et al. |
| 6,391,690 B1 | 5/2002 | Miyasaka |
| 6,396,147 B1 | 5/2002 | Adachi et al. |
| 6,399,454 B1 | 6/2002 | Yamazaki |
| 6,399,988 B1 | 6/2002 | Yamazaki |
| 6,420,758 B1 | 7/2002 | Nakajima |
| 6,426,276 B1 | 7/2002 | Ohnuma et al. |
| 6,429,097 B1 | 8/2002 | Voustas et al. |
| 6,436,745 B1 | 8/2002 | Gotou et al. |
| 6,461,943 B1 | 10/2002 | Yamazaki et al. |
| 6,489,189 B1 | 12/2002 | Yamazaki et al. |
| 6,512,504 B1 | 1/2003 | Yamauchi et al. |
| 6,531,713 B1 | 3/2003 | Yamazaki |
| 6,534,826 B1 | 3/2003 | Yamazaki |
| 6,541,294 B1 | 4/2003 | Yamazaki et al. |
| 6,576,926 B1 | 6/2003 | Yamazaki et al. |
| 6,579,736 B1 | 6/2003 | Yamazaki |
| 6,680,577 B1 | 1/2004 | Inukai et al. |
| 6,709,902 B1 | 3/2004 | Kitakado et al. |
| 6,737,304 B1 | 5/2004 | Yamazaki et al. |
| 6,743,649 B1 | 6/2004 | Yamazaki et al. |
| 2001/0034088 A1 | 10/2001 | Nakamura et al. |
| 2002/0028543 A1 | 3/2002 | Yamazaki et al. |
| 2002/0086469 A1 | 7/2002 | Kim et al. |

| | | | |
|---|---|---|---|
| 2002/0098628 A1 | 7/2002 | Hamada et al. | |
| 2002/0102764 A1 | 8/2002 | Yamazaki et al. | |
| 2002/0115271 A1 | 8/2002 | Yamazaki et al. | |
| 2002/0125480 A1 | 9/2002 | Nakamura et al. | |
| 2002/0134981 A1 | 9/2002 | Nakamura et al. | |
| 2002/0142554 A1 | 10/2002 | Nakajima | |
| 2002/0151120 A1 | 10/2002 | Yamazaki et al. | |
| 2002/0151154 A1 | 10/2002 | Yamazaki et al. | |
| 2002/0164843 A1 | 11/2002 | Yamazaki et al. | |
| 2002/0187594 A1 | 12/2002 | Yamazaki et al. | |
| 2002/0197785 A1 | 12/2002 | Yamazaki et al. | |
| 2003/0060057 A1 | 3/2003 | Raaijmakers et al. | |
| 2003/0062499 A1 | 4/2003 | Yamazaki | |
| 2003/0122129 A1 | 7/2003 | Yamazaki et al. | |
| 2003/0132900 A1 | 7/2003 | Yamauchi et al. | |
| 2003/0197179 A1 | 10/2003 | Yamazaki et al. | |
| 2004/0065902 A1 | 4/2004 | Yamazaki et al. | |

FOREIGN PATENT DOCUMENTS

| | | |
|---|---|---|
| JP | 05-109737 | 4/1993 |
| JP | 5-1097737 A | 4/1993 |
| JP | 7-130652 A | 5/1993 |
| JP | 06-151414 | 5/1994 |
| JP | 07-130652 A | 5/1995 |
| JP | 07-183540 | 7/1995 |
| JP | 08-078329 | 3/1996 |
| JP | 09-074207 | 3/1997 |
| JP | 9-115831 | 5/1997 |
| JP | 10-055951 | 2/1998 |
| JP | 3032801 | 2/2000 |
| JP | 2000-105081 | 4/2000 |
| JP | 3032801 | 4/2000 |
| JP | 2000-260777 A | 9/2000 |
| JP | 2001-210828 A | 8/2001 |
| JP | 2001-267264 | 9/2001 |

OTHER PUBLICATIONS

Miyake et al. *IEEE Transactions on Electron Devices*, vol. 43, No. 3, Mar. 1996 "*Characteristics of Buried-Channel pMOS Devices with Shallow Counter-Dopes Layers Fabricated Using Channel Preamorphization*" p. 444-449.

U.S. Appl. No. 10/020,961 filed: Dec. 19, 2001—Filing Receipt, Specification, Claims and Drawings.

U.S. Appl. No. 10/072,931, filed: Feb. 12, 2002—Filing Receipt, Specification, Claims and Drawings.

U.S. Appl. No. 10/056,055, filed: Jan. 28, 2002, Filing receipt, Specification, Claims and Drawings.

U.S. Appl. No. 10/074,050 filed: Feb. 14, 2002, Filing Receipt, Specification, Claims and Drawings.

U.S. Appl. No. 10/051,064 filed: Jan. 18, 2002, Filing Receipt, Specification, Claims and Drawings.

U.S. Appl. No. 10/097,641 filed: Mar. 15, 2002, Filing Receipt, Specification, Claims and Drawings.

D.J. Llewellyn et al. *IEEE 1997*; "*Implantation and annealing of Cu in InP for electrical isolation: microstructural characterization*" pp. 313-316.

Kevin Jones et al. *IEEE 2000*; "*Boron Diffusion upon Annealing of Laser Thermal Processed Silicon*"; pp. 111-114.

\* cited by examiner

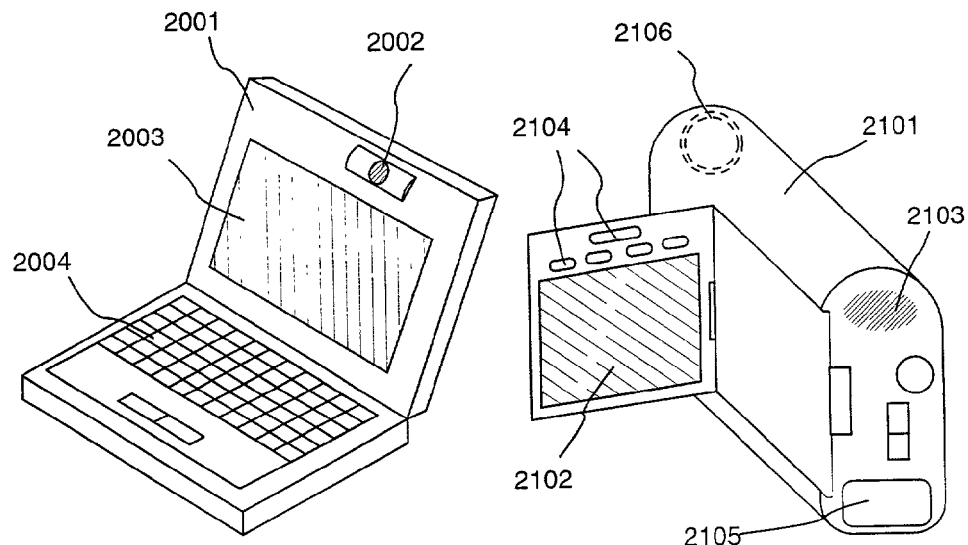
FIG. 16A
FIG. 16B
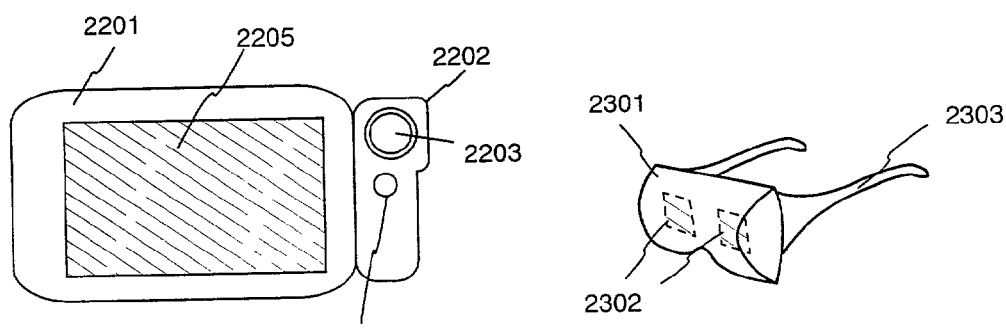
FIG. 16C
FIG. 16D
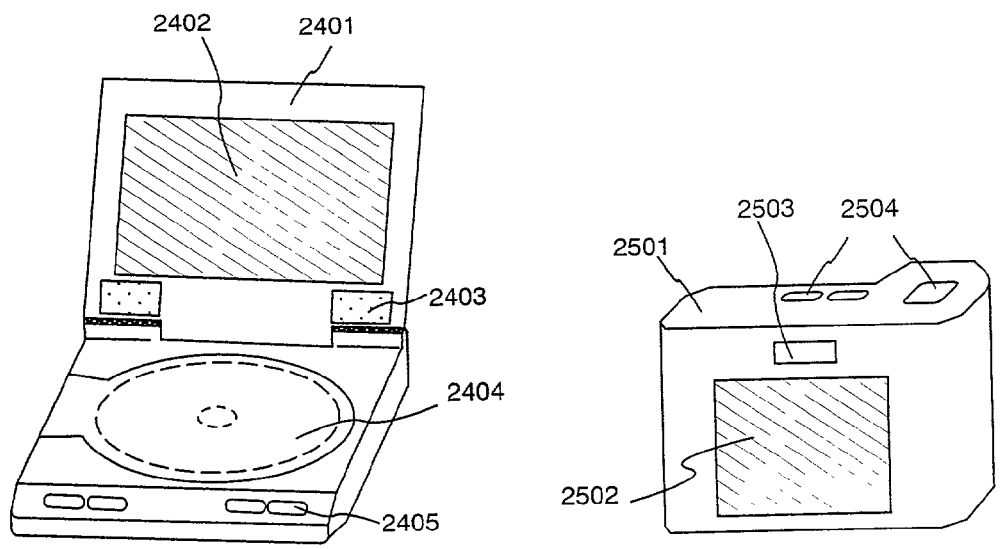
FIG. 16E
FIG. 16F

SEMICONDUCTOR DEVICE AND METHOD FOR MANUFACTURING THE SAME

BACKGROUND OF THE INVENTION

1. Technical Field of the Invention

This invention relates to a semiconductor device having a circuit configured with thin film transistors (hereinafter, referred to as TFTs) and a method for manufacturing the same, e.g. an electro-optical device represented by the liquid crystal display panel and an electronic apparatus mounted with such an electro-optical device as a part.

Incidentally, in the description, the semiconductor device refers to the device overall operable by making use of a semiconductor property, wherein the electro-optical device, the semiconductor circuit and the electronic apparatus, in any, are a semiconductor device.

2. Description of the Related Art

Recently, development has being proceeded for the semiconductor device that thin film transistors (TFTs) are configured with using a semiconductor film (in a thickness of nearly several to several hundred nm) formed on a substrate having an insulating surface thus having a large-area integrated circuit formed with the TFTs. The known representative examples include active-matrix liquid crystal modules, EL modules and contact-type image sensors. Particularly, the TFT using a crystalline silicon film (typically a polysilicon film) in an active layer (hereinafter, described polysilicon TFT) is high in electric-field mobility and allowed to form various functions of circuits.

For example, the liquid-crystal module mounted on a liquid-crystal display device has pixel-circuit-controlling driver circuits, such as a pixel circuit for image display based on a function block, a shift register circuit on the basis of CMOS circuits, a level shifter circuit, a buffer circuit and a sampling circuit, formed on one substrate.

Meanwhile, the pixel circuit of an active-matrix liquid crystal module has TFTs (pixel TFTs) respectively arranged in several tens to several millions of pixels wherein each pixel TFT has a pixel electrode. The counter substrate, sandwiching liquid crystal, has a counter electrode to form a kind of capacitor using a liquid crystal as dielectric. The voltage to be applied to each pixel is controlled by TFT switching function to control the charge onto the capacitor, thereby driving the liquid crystal and hence controlling transmission light amount for image display.

The TFT electric characteristic is ready to be influenced by the channel region in the neighborhood of an interface between a semiconductor and a gate insulating film. The present invention provides TFTs reduced in electric characteristic deviations and a method for manufacturing the same.

SUMMARY OF THE INVENTION

The present invention is characterized by forming a region or layer containing an inactive element, or rear gas element, in the channel region. Meanwhile, the invention adds a rear gas element selectively or entirely by using an ion doping or ion implantation technique. Meanwhile, because the invention adds a rear gas element not to bond with other atoms to a semiconductor film having a crystalline structure, the rear gas element is inserted to between the lattices in the semiconductor film. It is possible to perform gettering by utilizing a strained site formed upon adding the rear gas element. By the anneal with a heating process at a comparative high temperature, laser light (pulse-oscillated laser light or continuous-oscillated laser light) irradiation or intense light irradiation, the strained site formed by rear gas element addition may be reduced or removed. Incidentally, the added rear gas element less diffuses within or departs from the film even if performing a heating process at a comparative high temperature.

The silicon film having a crystalline structure, i.e. polysilicon film, includes lattice defects such as grain-boundary defects and stacking defects. The lattice defect acts as a carrier trap to worsen electric characteristics. Accordingly, in the TFT channel region, the volume or existence form of lattice defects forms the major cause of characteristic variations. In order to enhance homogeneity, the invention adds a rear gas element to distribute lattice defects evenly throughout the channel region without local segregation.

An invention disclosed in the description is in a semiconductor device having a semiconductor layer having a crystalline structure on an insulating surface, a semiconductor device characterized in that: the semiconductor layer has a source region, drain region and channel region, wherein the channel region contains a rear gas element (concentration range of $1 \times 10^{15} - 5 \times 10^{21}/cm^3$).

Meanwhile, another invention is
in a semiconductor device having a semiconductor layer having a crystalline structure on an insulating surface, a semiconductor device characterized in that:
the semiconductor layer has a source region, drain region and channel region, wherein a rear gas element is contained between the channel region and an insulating film. Incidentally, this region, containing a rear gas element, is higher in electric resistance value than the channel region.

Meanwhile, another invention is a semiconductor device comprising: a first semiconductor layer having a crystalline structure on an insulating surface: a second semiconductor layer in contact with the first semiconductor layer; an insulating film in contact with the second semiconductor layer; and an electrode in contact with the insulating film;
wherein the second semiconductor layer contains a rear gas element.

In the above structure, the semiconductor layer in section is in a two-layered structure, wherein one layer is added with a rear gas element. The semiconductor layer in two-layered structure is used as a TFT active layer. Where a rear gas element is added by an ion doping or ion implantation technique, the semiconductor layer turns into an amorphous state though depending upon addition conditions. Meanwhile, the semiconductor layer in an amorphous state, if re-crystallized by heating means (laser light or intense light irradiation, or heating process at a comparative high temperature), can be made in a semiconductor layer having a crystalline structure.

BRIEF DESCRIPTION OF THE DRAWINGS

FIGS. 16A to 16F are views showing examples of electronic appliances;

DETAILED DESCRIPTION OF THE PREFERRED EMBODIMENTS

The embodiment mode of the present invention will now be explained below.

Figure 1:
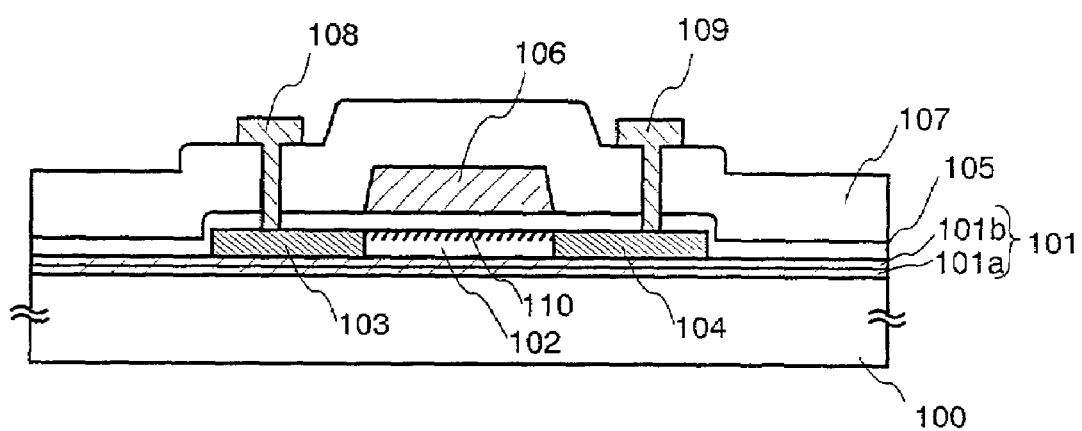
FIG. 1 is a view showing the present invention.

There is shown, in FIG. 1, an example of a TFT structure of the invention. Herein, explanation is on an n-channel TFT of a top gate type.

A substrate having an insulating surface 100 has thereon a two-layered base film (101a, 101b), to possess a semiconductor layer (channel region 102, source region 103 and drain region 104) on the base insulating film. Meanwhile, a gate insulating film 105 is provided covering the semiconductor layer, to provide a gate electrode 106 overlapped with the channel region through the sandwiched gate insulating film. Also, provided is an interlayer insulating film 107 covering the gate electrode. The interlayer insulating film 107 has therein a contact hole to provide a source electrode 108 in contact with the source region and a drain electrode 109 in contact with the drain region.

The invention has a layer 110 added with a rear gas element, in a region close to an interface between the gate insulating film 105 and the channel region 102, i.e. in an upper layer of the channel region. The upper layer in the channel region is a semiconductor film having an amorphous or crystalline structure. On the other hand, the lower layer in the channel region is a semiconductor film having a crystalline structure.

A manufacturing method for obtaining the above structure desirably uses a method shown in FIGS. 2A to 2G.

Figure 2A:
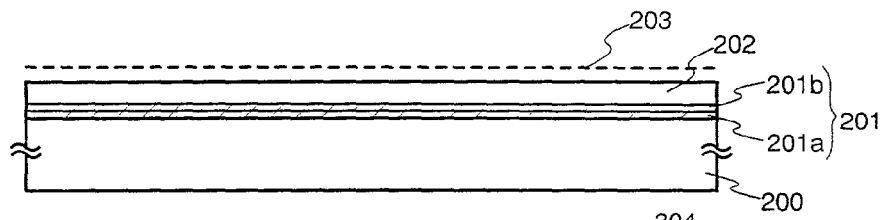
FIGS. 2A to 2G are views showing a manufacturing process of the invention.
Figure 2B:
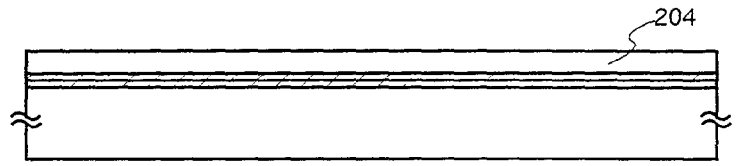
Figure 2C:
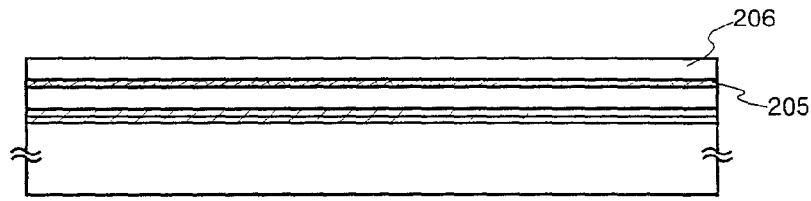

In FIG. 2A, 200 is a substrate having an insulating surface, 201 a base insulating film and 202 a semiconductor film having an amorphous structure.

First, on the substrate 200 is formed a base insulating film 201 as a blocking layer of a silicon oxide film, silicon nitride film or silicon oxynitride film. The base insulating film 201 uses herein a two-layered structure (a silicon oxynitride film 201a having a film thickness 50 nm and a silicon oxynitride film 201b having a film thickness 100 nm). However, it may use a single-layered film or a lamination structure having two or more layers. Note that, where there is no need to provide a blocking layer, a base insulating film may be omitted to form.

Then, a semiconductor film 202 having an amorphous structure is deposited over the base insulating film by known means (sputter process, LPCVD process, plasma CVD process or the like). A metal element for promoting crystallization is added onto the entire or a part of the amorphous-structured semiconductor film according to a technique disclosed in Japanese Patent Application Laid-Open No. 7-130652. Herein, an amorphous silicon film is formed to apply a nickel-containing solution to over the amorphous silicon film thereby forming a nickel-containing layer 203. As the other means than the forming method by application, it is possible to use means for forming an extremely thin film by a sputter process, an evaporation process or a plasma process.

Then, a heating process or intense light irradiation is carried out for crystallization. In this case, during crystallization, silicide is formed in a region of the semiconductor film which a metal element as a catalyst is in contact with, forming a nucleus for proceeding crystallization. This forms a crystalline semiconductor film 204 shown in FIG. 2B. In the case of crystallization by a heating process, it is preferred to carry out thermal crystallization (at 550–650° C., for 4–24 hours) after dehydrogenating the amorphous silicon film (at 500° C., for 1 hour). Meanwhile, in the case of crystallization by intense light irradiation, it is possible to employ one of infrared light, visible light and ultraviolet light or a combination thereof. Typically used is the light emitted from a halogen lamp, a metal halide lamp, a xenon arc lamp, a carbon arc lamp, a high-pressure sodium lamp or a high-pressure mercury lamp. The lamp source is turned on for 1–60 seconds, preferably 30–60 seconds, repeatedly 1–10 times wherein it is satisfactory to instantaneously heat the semiconductor film up to nearly 600–1000° C. Incidentally, if required, before irradiating intense light, a heating process may be made for the amorphous-structured semiconductor film 202 to give off the hydrogen contained therein. Meanwhile, crystallization may be made by simultaneously performing a heating process and intense light irradiation.

Then, in order to enhance the ratio of crystallization (ratio of a crystal component to the film entire volume) and repair the defects left in the grain boundaries, laser light is desirably irradiated to the crystalline-structured semiconductor film 204. The laser light uses a wavelength of 400 nm or smaller of excimer laser light or a second or third harmonic wave of YAG laser. In any case, used is a pulse laser light having a repetition frequency of approximately 10–1000 Hz, wherein the laser light may be focused by an optical system into 100–400 mJ/cm$^2$ to carry out a laser process on the crystalline semiconductor film 204 at an overlap ratio of 90–95%.

Although the example using a pulse laser was shown herein, a continuous oscillating laser may be used. In order to obtain a large grain-sized crystal during crystallization of an amorphous semiconductor film, a solid-state laser capable of oscillating continuously is preferably used to apply a second to fourth harmonic wave with respect to a basic wave. Typically, it is satisfactory to apply a second harmonic wave (532 nm) or third harmonic wave (355 nm) of an Nd:YVO$_4$ laser (basic wave 1064 nm). Where using a continuous oscillating laser, the laser light emitted from a continuous-oscillating YVO$_4$ laser having an output of 10 W is converted into a harmonic wave by a nonlinear optical device. Meanwhile, there is a method that a YVO$_4$ crystal and nonlinear optical device is placed in a resonator to emit a harmonic wave. Preferably, an optical system is used for irradiation to a subject of processing by formation of a laser light into a rectangular or elliptic form on an irradiation plane. This requires an energy density of nearly 0.01–100 MW/cm$^2$ (preferably 0.1–10 MW/cm$^2$). It is satisfactory to carry out irradiation by moving the semiconductor film at a velocity of 10–2000 cm/s relatively to the laser light.

Incidentally, although used herein was the art for irradiating laser light after carrying out thermal crystallization using nickel as a metal element for promoting silicon crystallization, the amorphous silicon film may be crystallized by a continuous oscillating laser (second harmonic wave of a $YVO_4$ laser) without adding nickel.

Then, an extremely thin oxide film 205 is formed by an ozone-containing solution, to form a semiconductor film 206 on the oxide film 205. (FIG. 2C) This oxidation film 205 serves as an etch stopper upon selectively removing only the semiconductor film 206 in the later process. Meanwhile, the semiconductor film 206 may be an amorphous-structured semiconductor film or crystalline-structured semiconductor film.

Then, a rear gas element is added to the semiconductor film 206 by an ion doping technique or ion implantation technique, to form a gettering site. (FIG. 2D) The rear gas element uses one or a plurality of ones selected from helium (He), neon (Ne), argon (Ar), krypton (Kr) and xenon (Xe). Such a rear gas is herein used as an ion source in order to form a gettering site, and implanted into the semiconductor film by an ion dope or ion implantation technique. The ion implantation with such a rear gas involves two significant points. Namely, one is to form dangling bonds by implant and cause strain in the semiconductor film while the other is to implant ions between the lattices of the semiconductor film thereby causing strain. The implant of rear gas ions can satisfy the both at the same time. Particularly, the latter is available conspicuously when using an element, such as argon (Ar), krypton (Kr) or xenon (Xe), greater in atom radius than silicon. Meanwhile, the implant of a rear gas element forms not only lattice strain but also unpaired bonds, contributing to gettering reaction. Also, where one conductivity type impurity element, phosphorus, is implanted in a semiconductor film in addition to a rear gas element. gettering is possible by making use of the Coulomb's force of phosphorus.

Figure 2D:
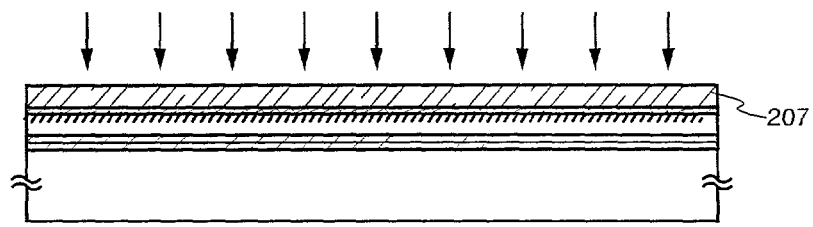
Figure 2E:
Figure 2F:
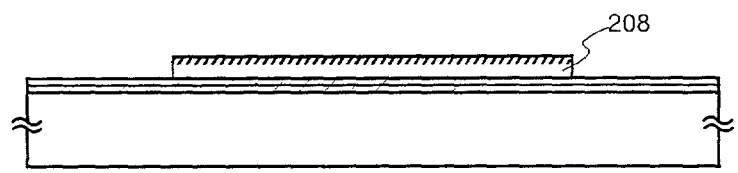
Figure 2G:
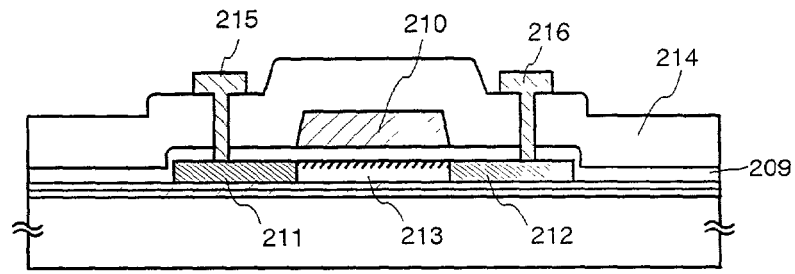
Figure 3:
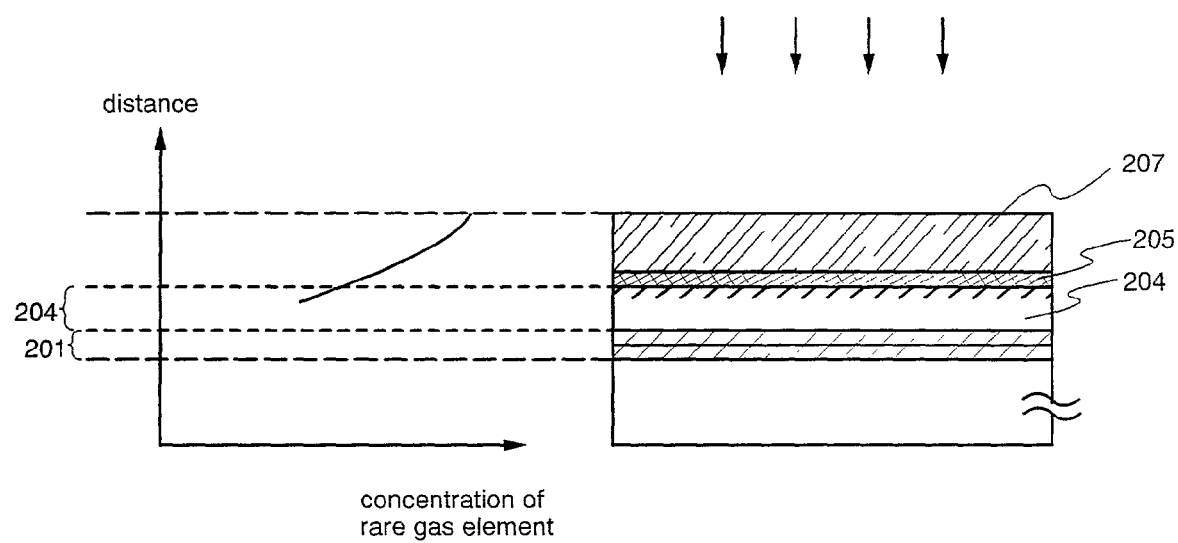
FIG. 3 is a view showing a concentration profile.
Figure 4:
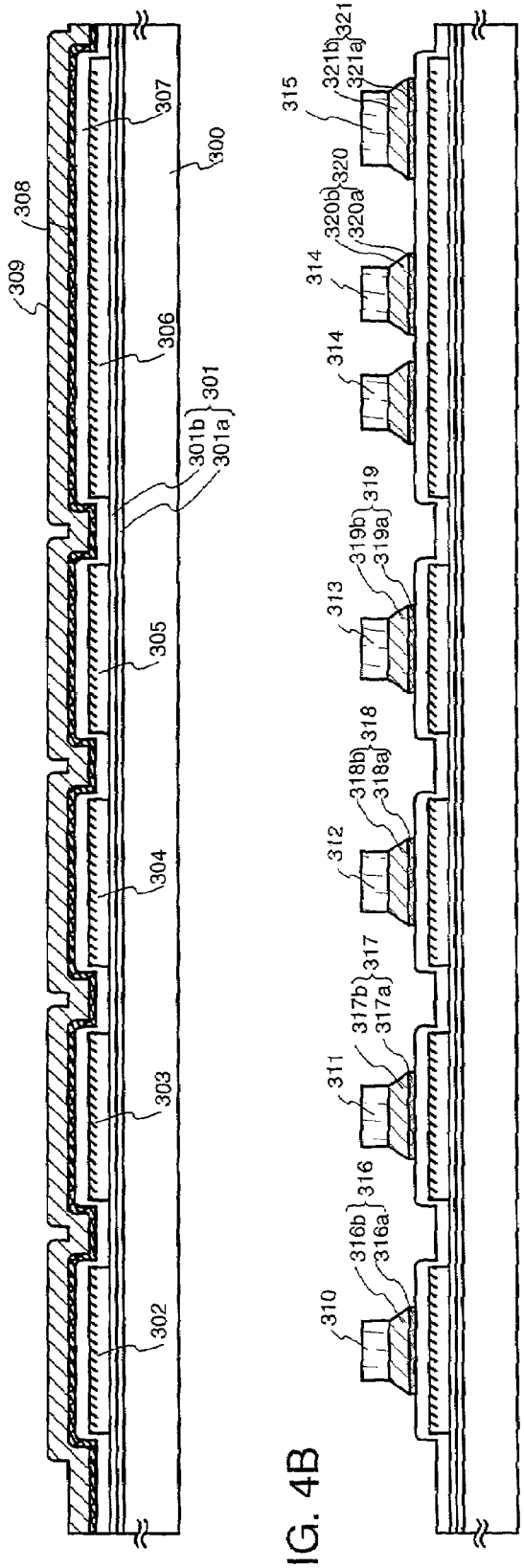
FIGS. 4A to 4C are views showing a manufacturing process for AM-LCD.
Figure 5:
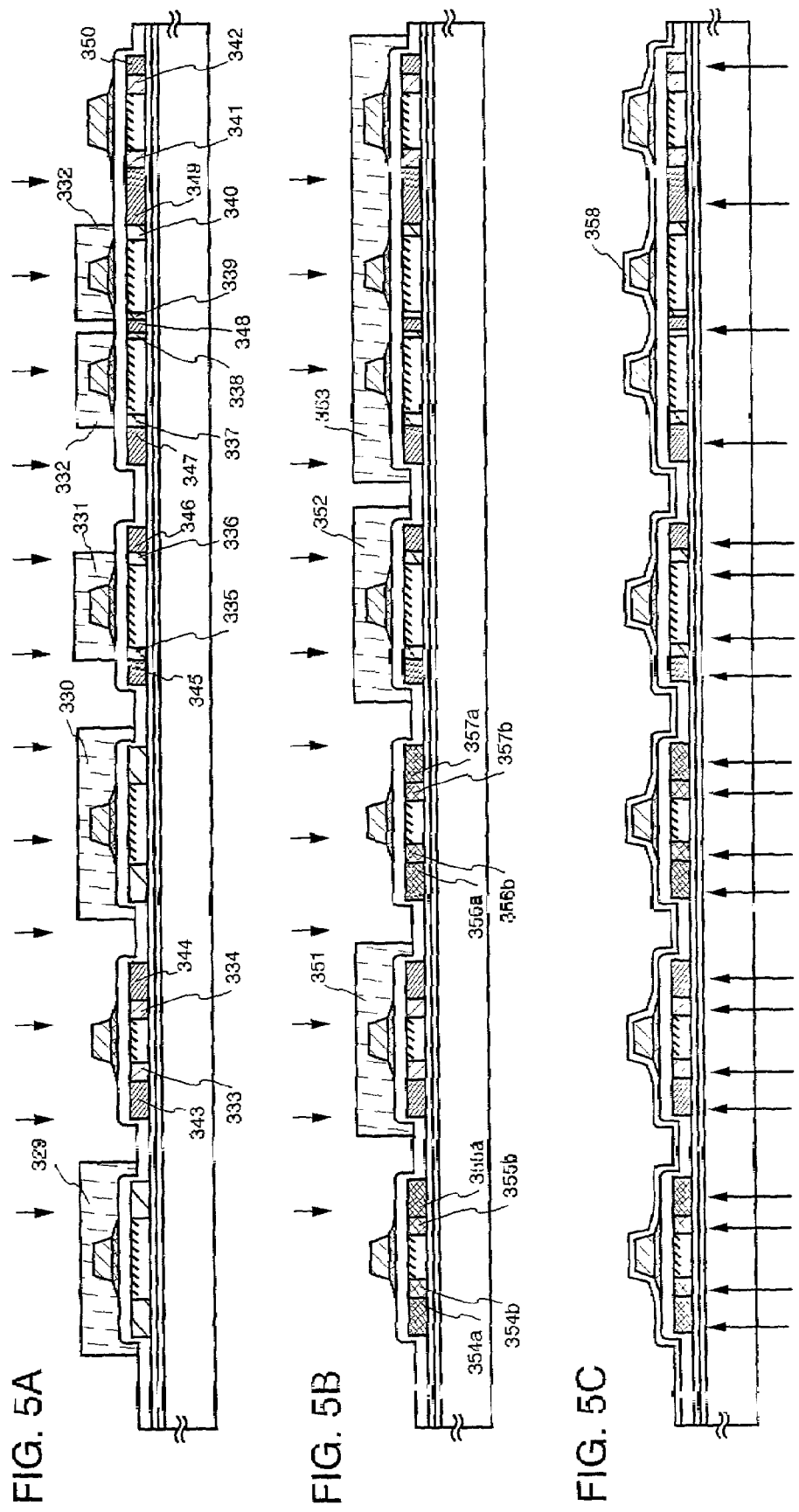
FIGS. 5A to 5C are views showing a manufacturing process for AM-LCD.
Figure 7:
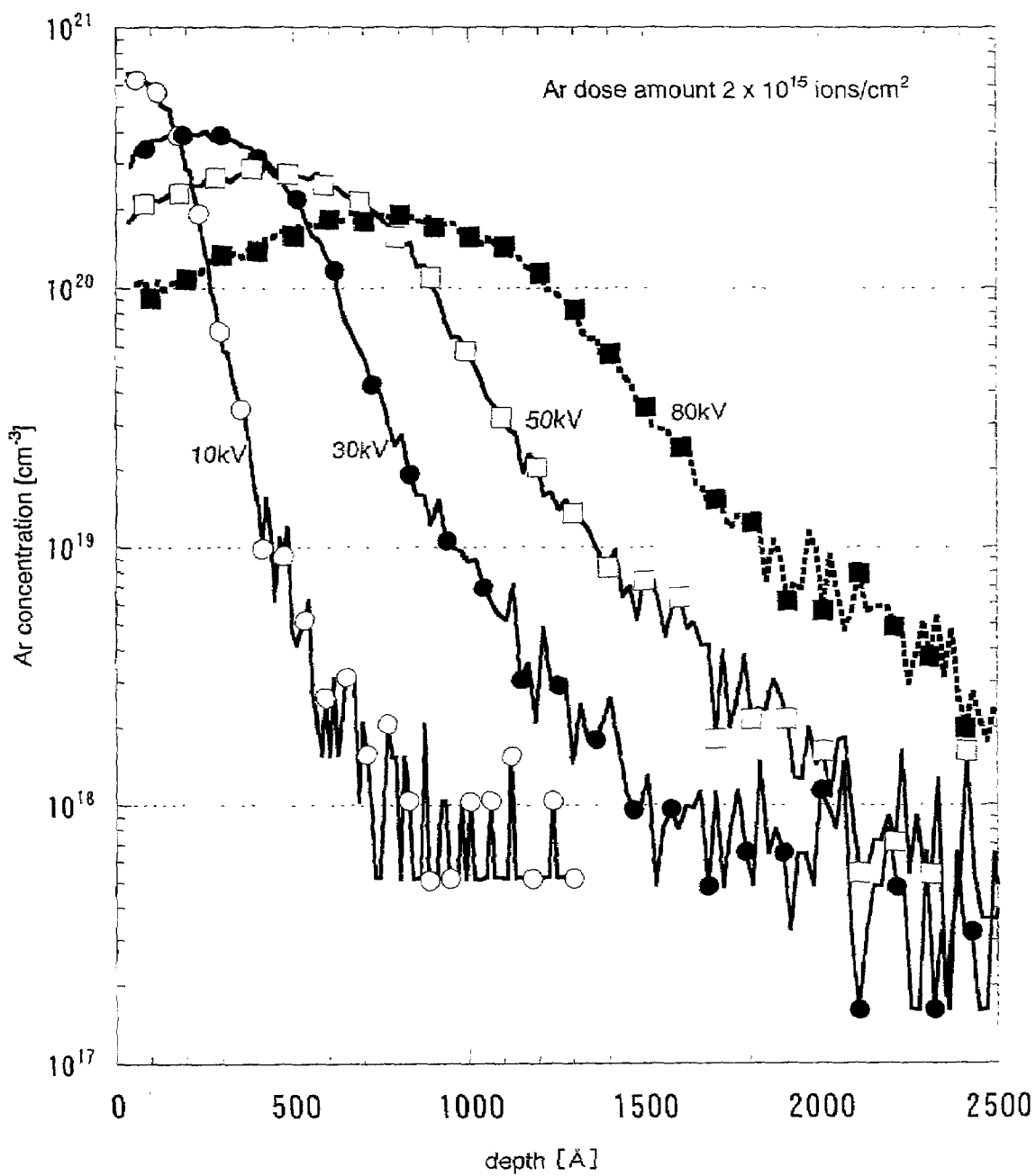
FIG. 7 is a figure showing an acceleration voltage dependency.

Meanwhile, during the process of FIG. 2D, the addition rear gas element has a concentration peak as the showing of an acceleration voltage dependency upon adding argon element in the ion doping technique in FIG. 7. By utilizing this, a rear gas element is added to the upper layer of the crystalline-structured semiconductor film 204 as shown in FIG. 3. However, the lower layer desirably maintains the crystalline structure as much as possible without adding the rear gas element. Note that the concentration profile and sectional view shown in FIG. 3 corresponds to FIG. 2D, wherein the same element used the same reference numeral.

Then, gettering is carried out. (FIG. 2E) The gettering process may be by a heating process in a nitrogen atmosphere at 450–800° C. for 1–24 hours, e.g. at 550° C. for 14 hours. Meanwhile, intense light may be irradiated from a lamp source, in place of a heating process using a furnace (including furnace anneal). Meanwhile, intense light may be irradiated in addition to the heating process. By the gettering, nickel moves in a direction of the arrow in FIG. 2E, thereby removing or reducing the concentration of the metal element contained in the semiconductor film 204 covered by the oxide film 205. This heating process serves also as anneal. Herein, the semiconductor film 204 also is added with a slight amount of rear gas element. It is, however, desired to fully carry out gettering so that nickel is all moved into the semiconductor film 207 without segregation in the semiconductor film 204, to an extent that there exists no nickel in the semiconductor film 204.

Figure 8:
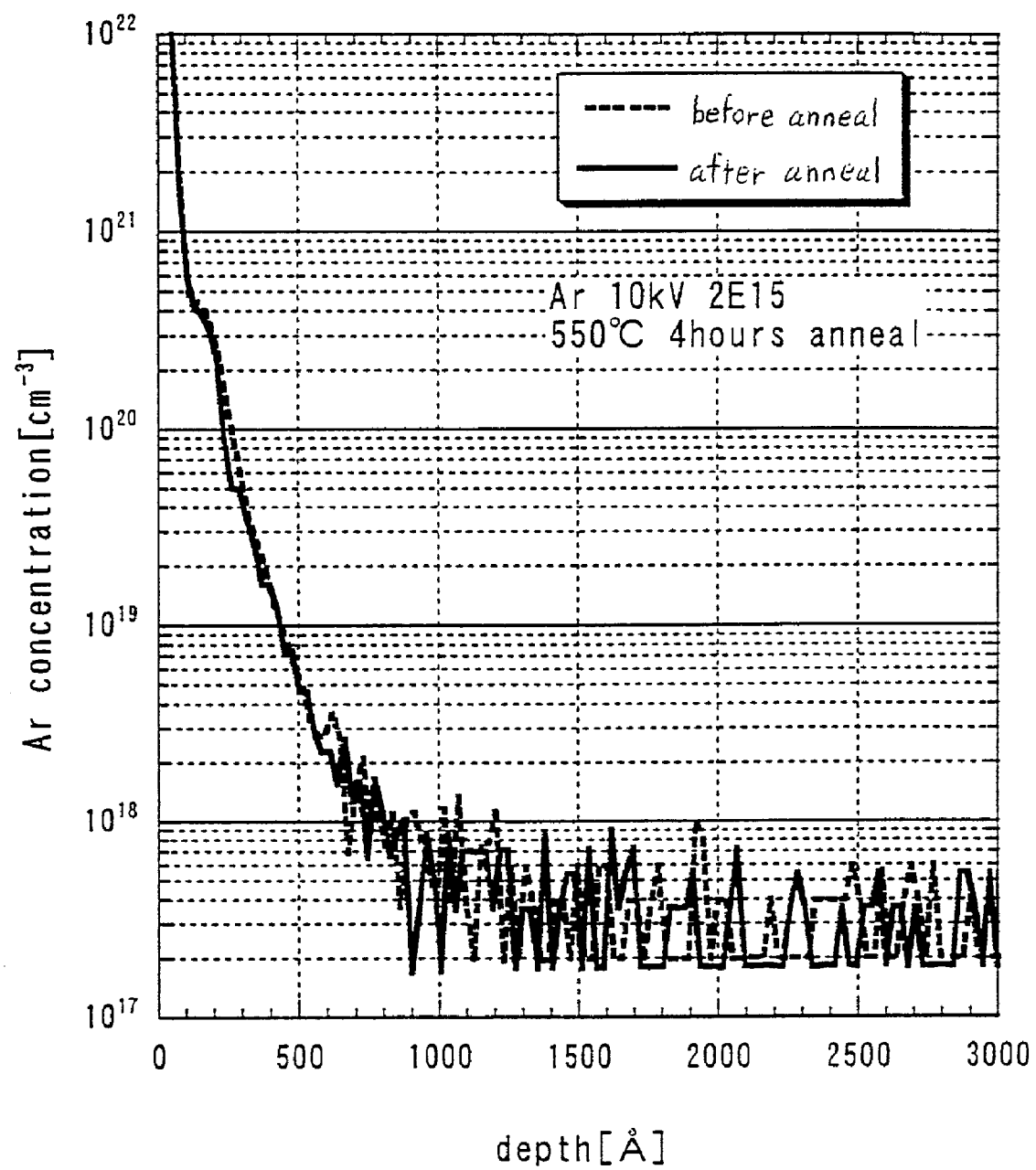
FIG. 8 is a figure showing an argon concentration profile.

FIG. 8 is a figure that a nickel acetate solution in 100 ppm is applied onto an amorphous silicon film having a film thickness of 300 nm and crystallized by a heating process at 550° C. for 4 hours to form a semiconductor film having a crystalline structure and thereafter added by argon under a condition (acceleration voltage of 10 keV, a dose of $2\times10^{15}/cm^2$) by an ion dope technique, a sample of which is measured for an argon concentration distribution in a depth direction of the film by SIMS analysis. It can be read, from FIG. 8, that the argon has been added with a concentration of $1\times10^{18}/cm^3$ or higher and in a depth of approximately 80 nm from a surface of the crystalline-structured semiconductor film.

Furthermore, FIG. 8 shows also a concentration distribution of the argon of after a heating process made on the sample at a temperature of 550° C. for 4 hours. The concentration of argon is not changed at or around the heating process, and the content amount is also not changed.

Figure 9:
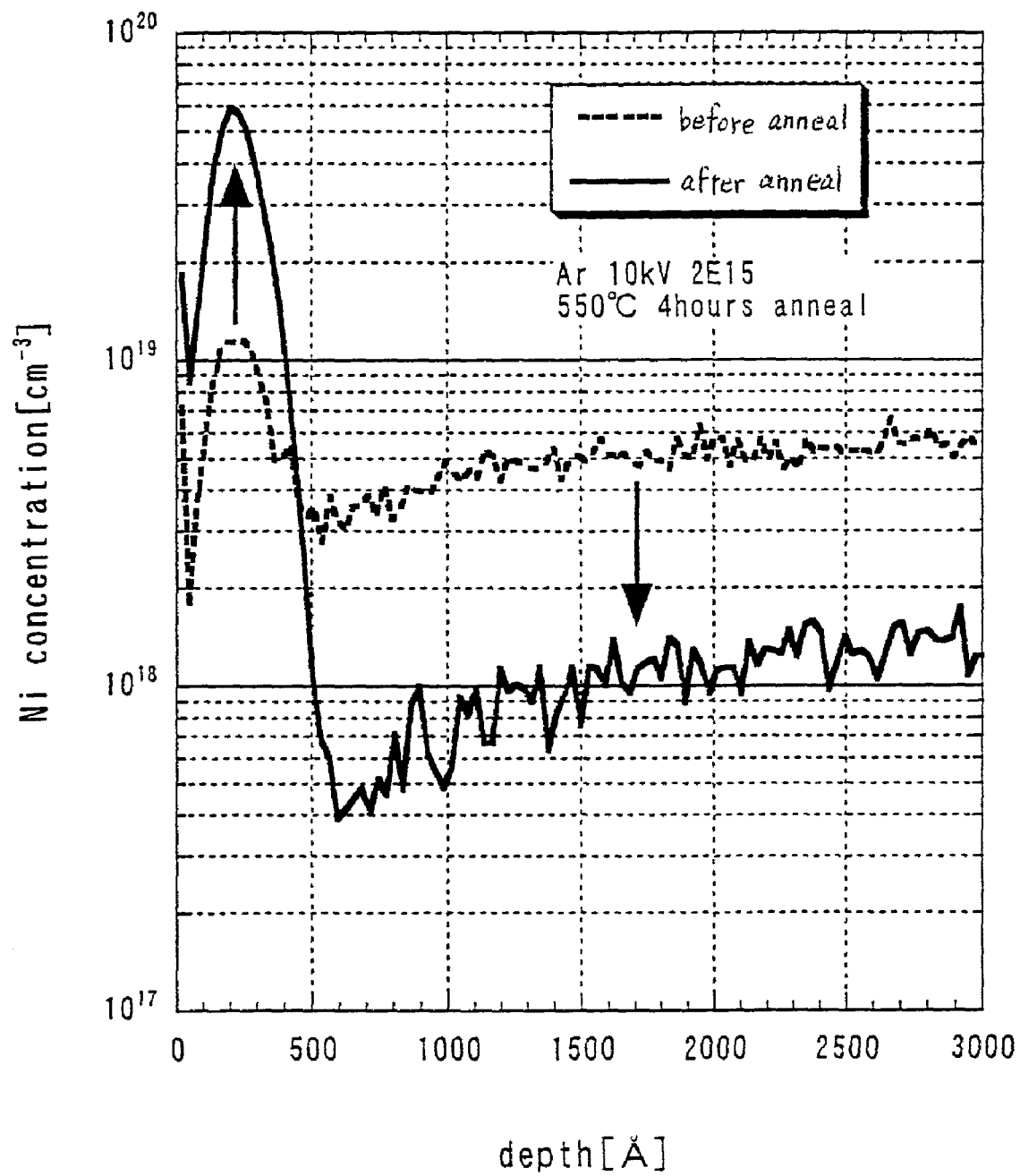
FIG. 9 is a figure showing a nickel concentration profile.

Meanwhile, FIG. 9 shows a SIMS analysis similarly conducted on the concentration of the nickel contained in the sample at or around the heating process, wherein the nickel existed in the film with a concentration of approximately $5\times10^{18}/cm^3$ is reduced down to $1\times10^{18}/cm^3$ by the heating process. The distribution of nickel concentration after heating process is changed to have an increased peak of nickel concentration in a region added with argon. From these, it can be seen that the nickel distributed in the film by the heating process has moved to the region added with argon. In this manner, FIG. 9 clearly shows the effect of gettering due to the argon addition and heating process.

Then, after the oxide film 205 is used as an etch stopper to selectively remove only the semiconductor film shown at 207, the semiconductor film 204 is formed into a desired form of a semiconductor layer 208 by using a known patterning technique.

Then, after cleaning the surface of the semiconductor layer by an etchant containing hydrogen fluoride, a silicon-based insulating film is formed for gate insulating film 209. It is desired to continuously carry out such surface cleaning and gate insulating film formation without exposure to the air.

Then, after cleaning the surface of the gate insulating film, a gate electrode 210 is formed. An impurity element (P, As or the like) for providing an n-type to the semiconductor, P herein, is appropriately added to form a source region 211 and a drain region 212. After addition, heating process, intense light irradiation or laser irradiation is carried out in order to activate the impurity element. Meanwhile, restoration is possible, simultaneously with the activation, from the plasma damage to the gate insulating film and from the plasma damage to the interface between the gate insulating film and the semiconductor layer. Particularly, it is extremely effective to activate the impurity element by irradiating a YAG-laser second harmonic wave at the main or back surface in an atmosphere at room temperature to 300° C. YAG laser, requiring less maintenance, is preferable activating means.

The processes from then on include to form an interlayer insulating film 214, hydrogenate for forming a contact hole reaching the source and drain regions and form source electrode 215 and drain electrode 216 thereby completing a TFT.

The TFT thus obtained contains a rear gas element at least in the upper layer of the channel region 213, as also shown in FIG. 1. The region containing the rear gas element has an electric resistance lower than the insulating film, forming a buffer layer higher than the lower layer of the semiconductor layer. Incidentally, with ion doping technique or ion implantation technique, the depth a rear gas element exists can be freely determined by properly selecting the conditions.

Incidentally, although herein is shown the example to add a rear gas element during gettering, it is satisfactory to property add a rear gas element after obtaining a semiconductor layer crystallized by using a known crystallization technique, e.g. laser crystallization technique or thermal crystallization technique.

Meanwhile, the invention is not limited to the structure of FIG. 1. If necessary, a lightly doped drain (LDD) structure may be provided which has an LDD region between the channel region and the drain region (or source region). This structure is provided with a region added at low concentration with an impurity element at between the channel region and the source region or drain region formed by adding an impurity element at a high concentration, which region is called an LDD region. Furthermore, it is possible to provide so-called a GOLD (Gate-drain Overlapped LDD) structure having an LDD region arranged overlapped with the gate electrode through the gate insulating film. Meanwhile, a region or layer containing a rear gas element may be formed in the LDD region or GOLD region.

Meanwhile, although explanation was herein made using an n-channel TFT, it is needless to say that a p-channel TFT can be formed by using a p-type impurity element in place of the n-type impurity element.

Meanwhile, although explanation was on the example of the top gate TFT, the invention can be applied regardless of the TFT structure, e.g. applicable to a bottom gate type (inverted stagger type) TFT or forward stagger type TFT.

Meanwhile, the concentration of a rear gas element contained in the upper layer of the semiconductor layer of the invention is $3 \times 10^{14}$–$2 \times 10^{20}$/cm$^3$, preferably $1 \times 10^{15}$–$1 \times 10^{20}$/cm$^3$, at least equal to or higher than a detection lower limit of SIMS.

The invention structured as above will be explained with greater detail by way of the following embodiments.

EMBODIMENTS

[Embodiment 1]

Explanation is herein made on a method to simultaneously form, on the same substrate, a pixel region and driver-circuit TFTs around the pixel region (n-channel TFTs and P-channel TFTs), using FIGS. 4A to 6.

First, the present embodiment uses a substrate 300 of glass such as barium boro-silicate glass represented by Coning #7059 glass or aluminum boro-silicate glass represented by Corning #1737 glass. Incidentally, the substrate 300, if light transmissive, is not limitative and may use a quartz substrate. Meanwhile, a plastic substrate may be used which possesses heat resistance to withstand at a process temperature in this embodiment.

Then, on the substrate 300 is formed a base film 301 of an insulating film, such as a silicon oxide film, silicon nitride film or silicon oxynitride film. The base film 301, although uses a two-layered structure in this embodiment, may use a structure of a single layer or two or more layers of the insulation films. For a first layer of a base film 301, a plasma CVD process is used to form, by deposition with a reaction gas of SiH$_4$, NH$_3$ and N$_2$O, a silicon oxynitride film 301a to a film thickness of 10–200 nm (preferably 50–100 nm). This embodiment formed a silicon oxynitride film 301a (composition ratio of Si=32%, O=27%, N=24%, H=17%) with a film thickness of 50 nm. Then, for a second layer of a base film 301, a plasma CVD process is used to laminate, by deposition with a reaction gas of SiH$_4$ and N$_2$O, a silicon oxynitride film 301b to a thickness of 50–200 nm (preferably 100–150 nm). This embodiment formed a silicon oxynitride film 301b (composition ratio of Si=32%, O=59%, N=7%, H=2%) with a film thickness of 100 nm.

Then, a semiconductor layer 302–306 is formed on the base film. The semiconductor layer 302–306 is formed by depositing a semiconductor film having an amorphous structure by known means (sputter process, LPCVD process or plasma CVD process) and then patterning a crystalline semiconductor film obtained by a known crystallizing process (laser crystallizing process, thermal crystallizing process or thermal crystallizing process using a catalyst of nickel or the like) into a desired form. The semiconductor layer 302–306 is formed in a thickness of 25–80 nm (preferably 30–60 nm). The crystalline semiconductor film, although not limited in material, is preferably formed of silicon or silicon-germanium (Si$_x$Ge$_{1-x}$(X=0.0001–0.02)) alloy.

This embodiment used a plasma CVD process to deposit an amorphous silicon film having 55 nm and then hold a solution containing nickel on the amorphous silicon film. The amorphous silicon film is dehydrogenated (500° C., 1 hour) and then thermally crystallized (550° C., 4 hours), followed by a laser anneal process for improving the crystallization to form a crystalline silicon film. Then, as shown in the embodiment, an extremely thin oxide film is formed on the surface by a solution containing ozone and then an amorphous silicon film is formed on the oxide film. A rear gas element is added to the entire surface of the amorphous silicon film to conduct gettering with a heating process. Thereafter, the amorphous silicon film only is removed to pattern the crystalline silicon film, followed by removing the oxide film. Incidentally, argon is ion-doped as a material gas upon adding a rear gas element. In this manner, formed was a semiconductor layer 302–306 having a crystalline silicon film. The state the semiconductor layer 302–306 have been patterned corresponds to FIG. 2F in the embodiment. Incidentally, after forming an oxide film, a slight amount of impurity element (boron or phosphorus) may be appropriately doped (also called channel dope) in order to control the TFT threshold voltage.

Then, the semiconductor layer 302–306 at its surface is cleaned by an etchant based on hydrogen fluoride such as buffer hydrogen fluoride, and then a silicon-based insulating film 307 is formed with a thickness of 40–150 nm by using a plasma CVD or sputter technique. This embodiment formed a silicon oxynitride film (composition ratio of Si=32%, O=59%, N=7%, H=2%) with a thickness of 115 nm by a plasma CVD process. Of course, the insulating film for a gate insulating film is not limited to a silicon oxynitride film but may be of a single layer or lamination structure of other form of insulating films containing silicon.

Then, as shown in FIG. 4A, on the gate insulating film 307 are formed a first conductor film 308 having a film thickness of 20–100 nm and a second conductor film 309 having a film thickness of 100–400 nm. This embodiment formed a first conductor film 308 of TaN film having a film thickness of 30 nm and thereon a second conductor film 309 of W film having, a film thickness of 370 nm. The TaN film was formed by a sputter process wherein sputtering was done using a Ta target in an atmosphere containing nitrogen. Meanwhile, the W film was formed by a sputter process using a W target. Besides, it is possible to form it by a thermal CVD process using tungsten hexafluoride (WF$_6$).

Incidentally, although in the embodiment the first conductor film 308 was of TaN and the second conductor film 309 was of W, they are not especially limited. They, in any, may use an element selected from Ta, W, Ti, Mo, Al, Cu, Cr and Nd, or an alloy material or compound material based on the elements in a single layer or lamination. Meanwhile, may be used a semiconductor film represented by a polysilicon film doped with an impurity element such as phosphorus. Otherwise, AgPdCu alloy may be used. Meanwhile, it is possible to use a combination that the first conductor film is by a tantalum (Ta) film and the second conductor film by a W film, a combination that the first conductor film is by a titanium nitride (TiN) film and the second conductor film by a W film, a combination that the first conductor film is by a tantalum nitride (TaN) film and the second conductor film by an Al film, or a combination that the first conductor film is by a tantalum nitride (TaN) film and the second conductor film by a Cu film.

Then, a photolithography process is used to form a resist mask 310–315 to carry out a first etch process for forming an electrode and interconnection. The first etch process is under first and second etch conditions. This embodiment used, as a first etch condition, an ICP (Inductively Coupled Plasma) etching technique using $CF_4$, $Cl_2$, and $O_2$ for an etching gas, wherein etching was carried out at a gas flow rate ratio of respectively 25/25/10 (sccm) with a plasma caused by turning on an RF (13.56 MHz) power at 500 W to a coil-formed electrode under a pressure of 1 Pa. By using an ICP etching process and appropriately adjusting an etch condition (amount of electric power applied to the coiled electrode, amount of electric power applied to an electrode on the substrate end, electrode temperature on the substrate end, etc.), the film can be etched into a desired taper form. Incidentally, the etch gas can use appropriately a chloride-based gas represented by $Cl_2$, $BCl_3$, $SiCl_4$ and $CCl_4$, a fluoride-based gas represented by $CF_4$, $SF_6$ and $NF_3$, or $O_2$. Herein used a dry etching apparatus (Model E645-□ ICP) using an ICP manufactured by Matsushita Electric. A 150-W RF (13.56 MHz) electric power is turned on also to the substrate end (sample stage), applying substantially a negative self-bias voltage. Incidentally, the electrode area size on the substrate side is 12.5 cm×12.5 cm while the coiled electrode area size (herein, a quartz disk provided with a coil) is 25 cm in diameter of a disk. Under the first etch condition, the W film is etched to form an end of the first conductor layer into a taper form. Under the first etch condition, the etch rate on W is 200.39 nm/min while the etch rate on TaN is 80.32 nm/min, wherein the selective ratio of W to TaN is approximately 2.5. The first etch condition provides a taper angle on W of approximately 26 degrees.

Thereafter, the resist mask 310–315 is not removed for change to a second etch condition. Using $CF_4$ and $Cl_2$ for an etching gas to provide a gas flow rate ratio of respectively 30/30 (sccm), a 500-W RF (13.56 MHz) electric power was turned on at a pressure 1 Pa to the coiled electrode to cause a plasma, thereby carrying out etching for approximately 30 seconds. A 20-W RF (13.56 MHz) electric power is turned on also to the substrate end (sample stage), applying a negative self-bias voltage. Under the second etch condition mixed with $CF_4$ and $Cl_2$, the W film and the TaN film are etched in the same degree. Under the second etch condition, the etch rate on W is 58.97 nm/min while the etch rate on TaN is 66.43 nm/min. Incidentally, in order to perform etching without leaving residue on the gate insulating film, the etching time is preferably increased by a percentage of 10–20%.

In the first etching process, by making a resist mask in a proper form, the first conductor layer and second conductor layer at an end is made into a taper form due to the effect of a bias voltage applied to the substrate end. The angle of the taper may be given 15–45 degrees.

In this manner, the first etching process forms a first-form conductor layer 316–321 having a first conductor layer and a second conductor layer (first conductor layer 316a–321a and second conductor layer 316b–321b). Although not shown, of the insulating film 307 for a gate insulating film, the region not covered by the first-form conductor layers 316–321 are formed by a region etched and reduced in thickness by nearly 10–20 nm.

This embodiment carries out, following the first etching process, a second etching process without removal of the resist mask. Herein, the etch gas uses $SF_6$, $Cl_2$ and $O_2$ to provide a gas flow rate ratio of respectively 24/12/24 (sccm) to cause a plasma by turning on a 700-W RF (13.56 MHz) electric power at a pressure of 1.3 Pa to the coiled electrode, thereby carrying out etching for 25 seconds. A 10 W RF (13.56 MHz) electric power is turned on also to the substrate end (sample stage), applying substantially a negative self-bias voltage. Under the second etch condition, the etch rate on W is 227.3 nm/min while the etch rate on TaN is 32.1 nm/min, wherein the selective ratio of W to TaN is 7.1. The etch rate on SiON as an insulating film 307 is 33.7 nm/min wherein the selective ratio of W to TaN is 6.83. In this manner, where using $SF_6$ in the etch gas, film reduction can be suppressed due to high selective ratio to the insulating film 307. Meanwhile, in the driver-circuit TFTs, the longer the channel lengthwise width in the taper is the higher the reliability becomes. Accordingly, when forming a taper, it is effective to carry out dry etching with an etch gas containing $SF_6$.

This second etching process provided a taper angle 70 degrees on the W. By the second etching process, a second conductor layer 322b–327b is formed. Meanwhile, the first conductor layer is almost not etched and a first conductor layer 322a–327a is formed. Thus, second-form conductor layers 322–327 are formed. In the second etching process, the etch gas can use $CF_4$, $Cl_2$ and $O_2$.

Then, after removing the resist mask, a first doping process is made to obtain a state of FIG. 4C. In the doping, the first conductor layer 322a–327a is used as a mask against an impurity element so that doping is carried out not to add the impurity element to the semiconductor layer beneath the taper of the first conductor layer. This embodiment used P (phosphorus) as an impurity element to perform plasma doping with a hydrogen-diluted gas having 5% of phosphine ($PH_3$) at a gas flow rate of 30 sccm. In this manner, a low-concentration impurity region ($n^{--}$ region) 328 is formed overlapped with the first conductor layer in a self-aligned manner. The concentration of the phosphorus (P) added to the low-concentration impurity region 328 is $1\times10^{17}$–$1\times10^{19}$/$cm^3$.

Meanwhile, the first doping process may be made such that doping is done to add the impurity element to the semiconductor layer beneath the taper of the first conductor layer. In such a case, a concentration gradient is provided depending upon a film thickness at the taper of the first conductor layer.

Then, after forming a resist mask 329–330, a second doping process is carried out to add an n-type-providing impurity element to the semiconductor layer. (FIG. 5A) Incidentally, the semiconductor layer to be formed later into an active layer of a p-channel TFT is covered by the mask 329, 330. The doping process may be by an ion dope technique or ion implantation technique. Herein, phosphorus is used as an n-type-providing impurity element and added by an ion dope technique with a hydrogen-diluted gas having 5% of phosphine ($PH_3$).

By the second doping process, the semiconductor layer 303, to be formed later into an n-channel TFT for a logic circuit portion, has the conductor layer 323 as a mask against phosphorus to form a high-concentration impurity region ($n^+$ region) 343, 344 in a self-aligned manner. Also, in the second doping process, addition is made also to the beneath of the taper thereby forming a low-concentration impurity region ($n^-$ region) 333, 334. Accordingly, an n-channel TFT for a logic circuit portion to be formed later has only a region overlapped with a gate electrode (GOLD region). Incidentally, in the low-concentration impurity region ($n^-$ region) 333, 334, the semiconductor layer overlapped with the taper of the first conductor layer has an impurity concentration (P concentration) gradually decreasing in a direction of from a taper end of the first conductor layer toward the inside.

Meanwhile, by the second doping process, the semiconductor layer 305, to be formed later into an n-channel TFT for a sampling circuit portion, is formed by a high-concentration impurity region 345, 346 in a region not covered by the mask 331 and a low-concentration impurity region ($n^{--}$ region) 335, 336 in a region covered by the mask 331. Accordingly, an n-channel TFT for a sampling circuit portion has only a low-concentration impurity region (LDD region) not overlapped with a gate electrode.

Meanwhile, by the second doping process, the semiconductor layer 306, to be formed later into an n-channel TFT for a pixel portion, is formed by a high-concentration impurity region 347–350 in a region not covered by the mask 332 and a low-concentration impurity region ($n^{--}$ region) 337–340 in a region covered by the mask 332. Accordingly, an n-channel TFT for a pixel portion later has only a low-concentration impurity region (LDD region) not overlapped with a gate electrode. Also, in the region to be formed later into a capacitance part of a pixel portion, a high-concentration impurity region 350 is formed in a self-aligned manner, thus forming a low-concentration impurity region ($n^-$ region) 341, 342 beneath the taper.

The second doping process adds an n-type-providing impurity element in a concentration range of $3 \times 10^{19}$–$1 \times 10^{20}/cm^3$ to the high-concentration impurity region 343–350.

Meanwhile, a rear gas element may be added at or around the second doping. In such a case, gettering can be further done in a later thermal process. In such a case, it is desired to use, in the second doping process, such a mask as to provide addition to all the ends in the semiconductor layer.

Then, after removing the mask 329–332, the semiconductor layer to be formed later into an active layer of an n-channel TFT is covered by a resist mask 351–353 to carry out a third doping process. (FIG. 5B) A p-type impurity element is added through the taper to form a region containing the p-type impurity element in a low concentration (region overlapped with a gate electrode (GOLD region) 354b–357b). By the third doping process, formed is a region 354a–357a containing an n-type impurity element in a low concentration and a p-type impurity element in a high concentration. The region 354a–357a, although containing a low concentration of phosphorus, is doped to a boron concentration of $6 \times 10^{19}$–$6 \times 10^{20}/cm^3$. This causes no problem in operation as source and drain regions of a p-channel TFT.

Meanwhile, although the embodiment carried out the first doping process, the second doping process and the third doping process in the order, the process order can be freely changed without especial limitation.

Then, the resist mask 351–353 is removed to form a first interlayer insulating film 358. The first interlayer insulating film 358 is formed by an insulating film containing silicon having a thickness of 10–200 nm by the use of a plasma CVD process or sputter process.

Then, as shown in FIG. 5C, carried out is a process to activate the impurity element added in the respective semiconductor layers. This activation process is made by irradiating a YAG laser or excimer laser at a back surface. The irradiation at the back surface makes it possible to activate the impurity region overlapped with the gate electrode through an insulating film.

Meanwhile, although the embodiment showed the example to form a first interlayer insulating film prior to the activation, the process may be to form a first interlayer insulating film after the activation.

Then, a second interlayer insulating film 359 is formed by a silicon nitride film to carry out a heating process (heating process at 300–550° C. for 1–12 hours), thus carrying out a process to hydrogenate the semiconductor layer. This embodiment carried out a heating process in a nitrogen atmosphere at 410° C. for 1 hour. This process is a process to terminate the dangling bonds in the semiconductor layer by the hydrogen contained in the second interlayer insulating film 359. The semiconductor layer can be hydrogenated regardless of the presence of a first interlayer insulating film. As other means for hydrogenation, plasma hydrogenation (using the hydrogen excited by a plasma) may be made.

Then, formed is a third interlayer insulating film 360 of an organic insulating material on the second interlayer insulating film 359. This embodiment formed an acryl resin film having a film thickness of 1.6 μm. Then, patterning is made to form a contact hole reaching each high-concentration impurity region. This embodiment carried out etching processes in plurality. In this embodiment, the second interlayer insulating film is used as an etch stopper to etch the third interlayer insulating film, and then the first interlayer insulating film is used as an etch stopper to etch the second interlayer insulating film, followed by etching the first interlayer insulating film.

Then, formed are an electrode 361–369 electrically connected to the high-concentration impurity region and a pixel electrode 370 electrically connected to the high-concentration impurity region 349. These electrode and pixel electrode use a material excellent in reflectivity, e.g. a film based on Al or Ag or a lamination thereof.

Figure 6:
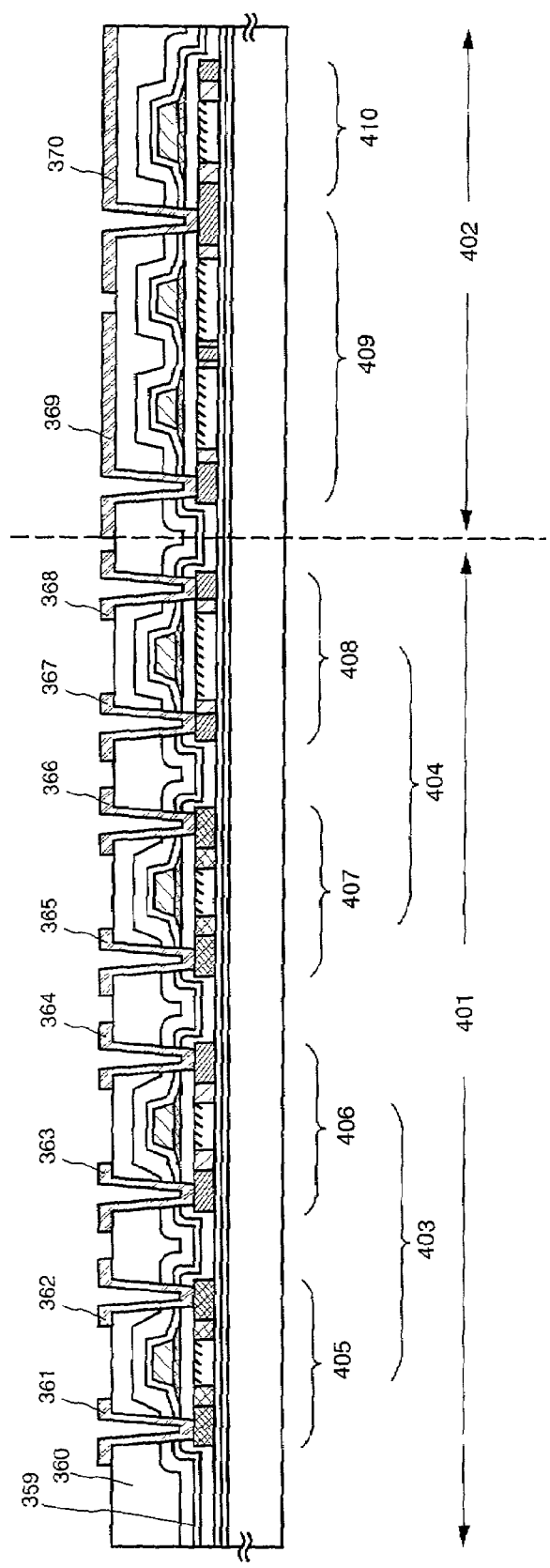
FIG. 6 is a view showing a manufacturing process for AM-LCD.

By the above, it is possible to form, on the same substrate, a driver circuit 401 having a logic circuit 403 formed by the n-channel TFT 406 and p-channel TFT 405 and a sampling circuit 404 formed by an n-channel TFT 408 and p-channel TFT 407, and a pixel portion 402 having a pixel TFT formed by an n-channel TFT 409 and a storage capacitor 410. (FIG. 6)

Incidentally, although the embodiment has a structure that the n-channel TFT 409 has two channel regions between the source and drain regions (double-gate structure), the embodiment is not limited to the double-gate structure but may be in a single-gate structure having one channel region or a triple-gate structure having three channel regions.

This embodiment is characterized to separately form high-concentration impurity regions suited for the circuits in a self-aligned manner by the second doping process or by the mask. The n-channel TFTs 406, 408, 409, in any, are in an LDD (Lightly Doped Drain) structure. Furthermore, the n-channel TFT 406 is so-called of a GOLD structure arranged with an LDD region overlapped with the gate electrode through a gate insulating film. Meanwhile, the n-channel TFTs 408, 409 are of a structure having only a region (LDD region) not overlapped with the gate electrode. Incidentally, in the description, the low-concentration impurity region (n⁻ region) overlapped with the gate electrode through an insulating film is referred to as a GOLD region while the low-concentration impurity region (n⁻⁻ region) not overlapped with the gate electrode is referred to as an LDD region. The width of the region not overlapped with the gate electrode (LDD region) in a channel direction can be freely set by properly changing a mask in the second doping. Meanwhile, by changing the first doping condition to add an impurity element also to the beneath of the taper, the n-channel TFT 408, 409 can be made in a structure having both of a region overlapped with the gate electrode (GOLD region) and a region not overlapped with the gate electrode (LDD region).

[Embodiment 2]

This embodiment shows, in FIGS. 10A to 10G, an example to form a semiconductor layer by a process different from Embodiment 1.

Figure 10A:
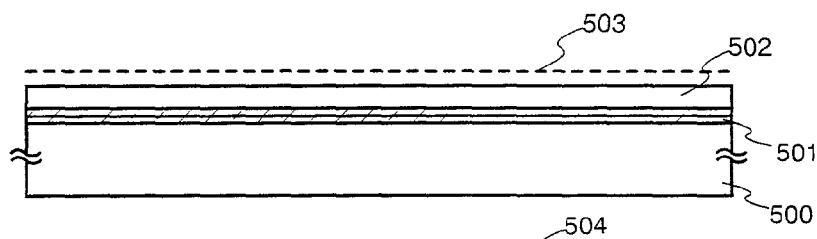
FIGS. 10A to 10G are views showing a manufacturing process of the invention.
Figure 10B:
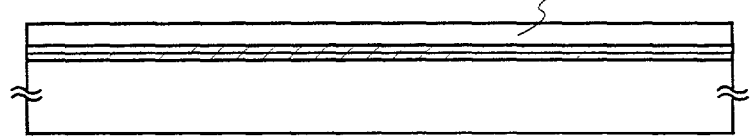
Figure 10C:
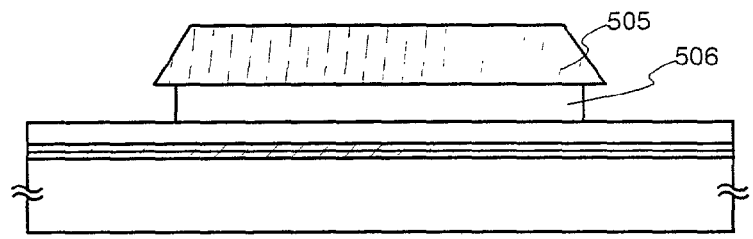

First, a base insulating film 501, an amorphous semiconductor film 502 and a metal-containing layer 503 are formed in the order on a substrate 500, similarly to Embodiment 1. (FIG. 10A) Then, crystallization is carried out similarly to Embodiment 1, to form a semiconductor film 504 having a crystalline structure. (FIG. 10B)

Figure 10D:
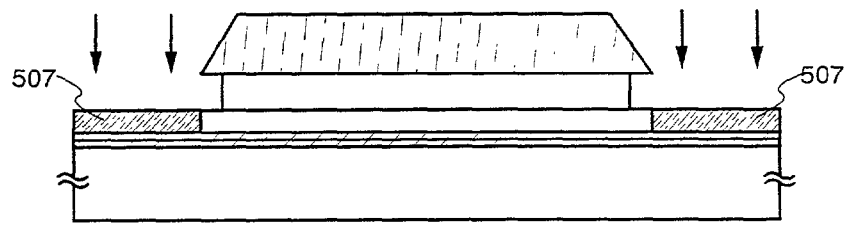
Figure 10E:
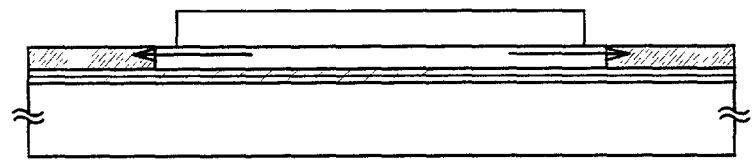
Figure 10F:
Figure 10G:
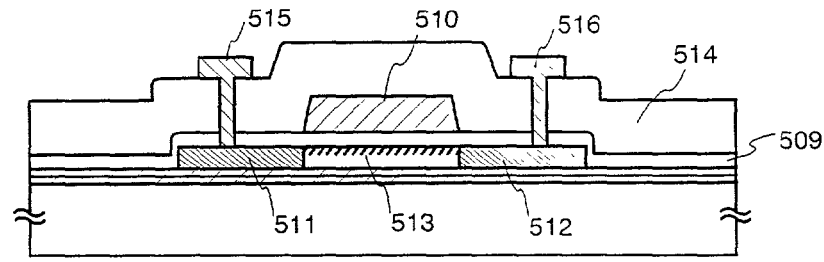

Then, after forming a silicon-based insulating film, a mask 505 is formed of resist. Then, the mask 505 is used to form a mask 506 by wet etching. (FIG. 10C) The mask 505 has a taper form at its end. By wet etching through this, the mask 506 of an insulating film based on silicon at an end is formed inward of the end of the mask 505. This mask 506 is to be used in patterning a crystalline semiconductor film. Then, although a rear gas element is added to the semiconductor film by an ion doping or ion implantation process, the addition is only to the region not overlapped with the mask 505, thus forming a gettering site 507. (FIG. 10D) Meanwhile, as shown in FIG. 10D, a spacing is provided between the mask 506 and the gettering site 507. This spacing will be important during gettering to be later carried out.

Meanwhile, the rear gas element may be added also to the region overlapped with the mask 505 by reducing the thickness of the mask 505 and mask 506.

Then, after removing the resist mask 505, a heating process is made to carry out gettering. Due to the heating process, the metal element contained in the film moves in a direction of the arrow in FIG. 10E. The gettering removes or reduces the metal element in the semiconductor film having a crystalline structure covered by the mask 506.

Then, a slight amount of rear gas element is again added into the semiconductor film through the mask 506. By the second rear gas addition, the rear gas element is contained at least in the channel region. Although the second rear gas addition was made herein after gettering, the second rear gas addition may be made after the patterning of the semiconductor layer as a later process or after forming a gate insulating film to be formed later. Incidentally, in order to control the TFT threshold voltage, a slight amount of impurity element (boron or phosphorus) may be appropriately doped (called also channel dope). Meanwhile, during such channel doping, a rear gas element may be added to the semiconductor layer.

Then, the mask 506 is used to pattern the crystalline-structured semiconductor film into a desired form, thereby forming a semiconductor layer 508. (FIG. 10F) During the patterning, the gettering site 507 is removed and, simultaneously, removed is the crystalline-structured semiconductor film in a region close to the boundary on the gettering site. In gettering of the embodiment, the metal element segregates in the gettering site wherein it is ready to much segregate at the boundary on the gettering site. Accordingly, it is very effective to provide a spacing between the gettering site and the mask 506 as in the embodiment.

Then, after cleaning the surface of the semiconductor layer by an etchant containing hydrogen fluoride, formed is a silicon-based insulating film to be formed into a gate insulating film 509. It is desired to continuously carry out such surface cleaning and gate insulating film formation without exposure to the air.

Then, after cleaning the surface of the gate insulating film, a gate electrode 510 is formed. An n-type-providing impurity element to the semiconductor, herein phosphorus, is appropriately added to form a source region 511 and a drain region 512. After addition, heating process, intense light irradiation or laser light irradiation is carried out in order to activate the impurity element. Meanwhile, simultaneously with the activation, restoration can be made from the plasma damage to the gate insulating film or the plasma damage to the interface between the gate insulating film and the semiconductor layer. Particularly, it is extremely effective to irradiate a YAG-laser second harmonic wave at the main or back surface in an atmosphere from room temperature to 300° C. thereby activating the impurity element. YAG laser, requiring less maintenance, is preferable activating means.

The process from now on includes forming an interlayer insulating film 514, carry out hydrogenation, forming a contact hole reaching the source and drain regions, forming a source electrode 515 and a drain electrode 516, and completing a TFT.

The TFT thus obtained contains a rear gas element at least in the channel region 513.

[Embodiment 3]

This embodiment shows, in FIGS. 11A to 11E, an example to add a rear gas element by using a mask having an opening size-reduced as compared to Embodiment 2.

Figure 11A:
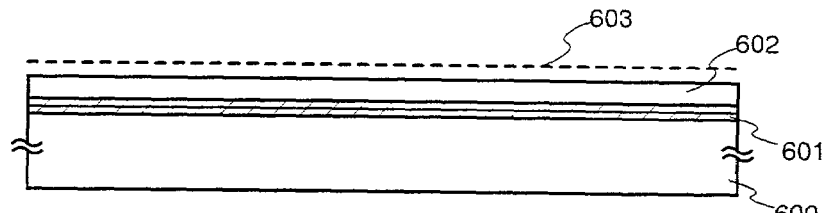
FIGS. 11A to 11E are views showing a manufacturing process of the invention.
Figure 11B:
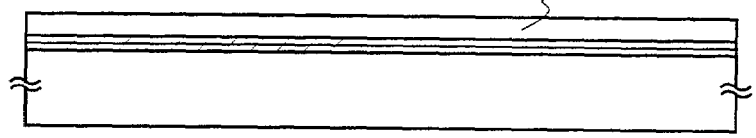

First, a base insulating film 601, an amorphous semiconductor film 602 and a metal-containing layer 603 are formed in the order on a substrate 600, similarly to Embodiment 1. (FIG. 11A) Then, crystallization is carried out similarly to Embodiment 1, to form a semiconductor film 604 having a crystalline structure. (FIG. 11B)

Figure 11C:
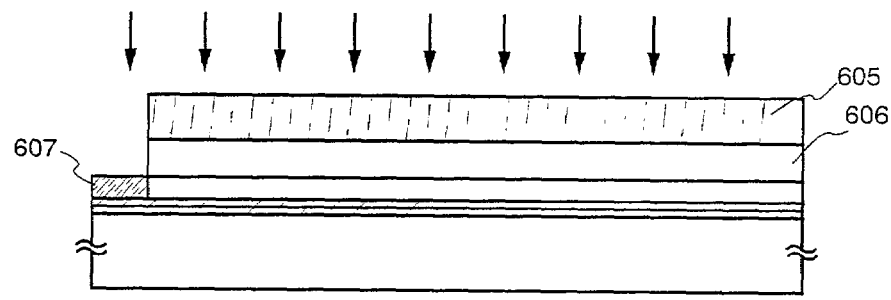
Figure 11D:
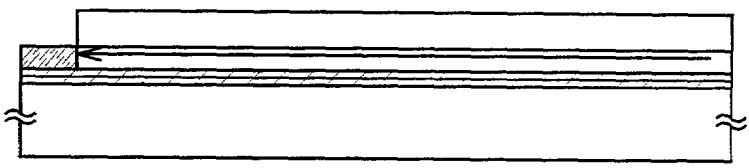

Then, after forming an insulating film based on silicon, a resist mask 605 is formed. Then, the mask 605 is used to form a mask 606 by etching. Then, a rear gas element is selectively added to form a gettering site 607. (FIG. 11C)

Then, after removing the resist mask 605, a heating process is carried out for gettering. By the heating process, the metal element contained in the film moves in a direction of the arrow in FIG. 11D. The gettering removes or reduces the metal element in the crystalline-structured semiconductor film covered by the mask 606.

Figure 11E:
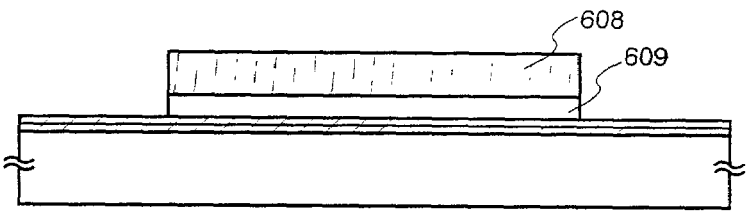

Then, after removing the mask 606, a resist mask 608 is formed to pattern the crystalline-structured semiconductor film, thus obtaining a semiconductor layer 609. (FIG. 11E)

Then, the mask 608 is removed. The process from now on may be according to the EMBODIMENT MODE or Embodiment 1.

[Embodiment 4]

This embodiment shows, in FIGS. 12A to 12D, an example of crystallization by a method different from Embodiment 1.

Figure 12A:
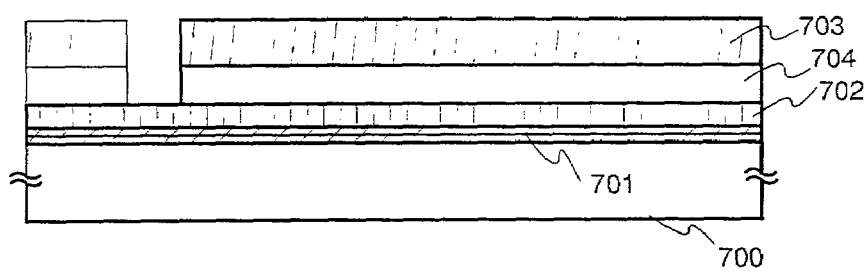
FIGS. 12A to 12D are views showing a manufacturing process of the invention.
Figure 12B:
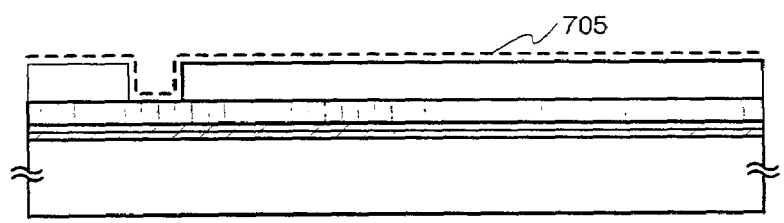
Figure 12C:
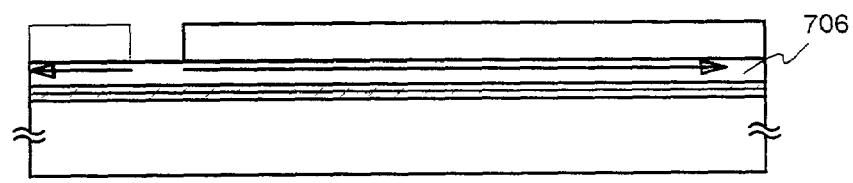
Figure 12D:
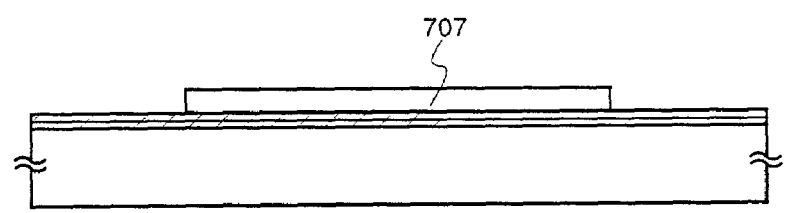

First, a base film 701 and an amorphous semiconductor film 702 are formed on a substrate 700, similarly to Embodiment 1. Then, a silicon-based insulating film is formed to form a resist mask 703. Then, the mask 703 is used to selectively remove the insulating film thus forming a mask 704. (FIG. 12A)

Then, after removing the mask 703, a metal-containing layer 705 is formed. Herein, a metal element is selectively added to the amorphous semiconductor film in a position not covered by the mask 704.

Then, a heating process is carried out to form a crystalline-structured semiconductor film 706. This heating process may use heating process by an electric furnace or irradiation of intense light. The heating process by an electric furnace may at 500–650° C. for 4–24 hours, e.g. 550° C. for 4 hours. Nickel diffuses in a direction shown at the arrow in FIG. 12C and crystallization proceeds. The heating process causes crystallization in the amorphous semiconductor film in a part contacting the insulating-film mask 704 by the action of nickel.

Then, after removing the mask 704, patterning is made to obtain a semiconductor layer 707. The process from now on may be according to the EMBODIMENT MODE or Embodiment 1.

Meanwhile, this embodiment can be combined with Embodiment 1 or 2.

Incidentally, combination is also possible with Embodiment 3. In the case of a combination with Embodiment 3, it is possible to make the same a mask for adding a metal element and a mask for adding a rear gas element.

[Embodiment 5]

In this embodiment, a process for manufacturing an active matrix liquid crystal display device using the active matrix substrate manufactured in Embodiment 1 will be described. The description is made with reference to FIG. 13.

First, after the active matrix substrate with the state of FIG. 6 is obtained according to Embodiment 1, an alignment film is formed on the active matrix substrate of FIG. 6 to perform a rubbing process. Note that, in this embodiment, before the formation of the alignment film, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate is prepared. A color filter in which a colored layer and a light-shielding layer are arranged corresponding to each pixel is provided in this opposing substrate. Also, a light-shielding layer is provided in a portion of a driver circuit. A leveling film for covering this color filter and the light-shielding layer is provided. Next, a counter electrode made of a transparent conductive film is formed in a pixel portion on the leveling film, and then an alignment film is formed on the entire surface of the opposing substrate to perform a rubbing process.

Then, the active matrix substrate in which the pixel portion and the driver circuit are formed and the opposing substrates are adhering to each other by using a sealing member. The filler is mixed with the sealing member, and two substrates are adhering to each other with a uniform interval by this filler and the columnar spacer. After that, a liquid crystal material is injected into a space between both substrates and then completely encapsulated by a sealing member (not shown). A known liquid crystal material may be used as the liquid crystal material. Thus, the active matrix liquid crystal display device is completed. If necessary, the active matrix substrate or the opposing substrate is cut with a predetermined shape. Also, a polarization plate and the like are suitably provided using a known technique. And, an FPC is adhering to the active matrix liquid crystal display device using a known technique.

A structure of a liquid crystal module thus obtained will be described using a top view of FIG. 13. Note that the same reference symbols are used for portions corresponding to those of FIG. 6.

Figure 13:
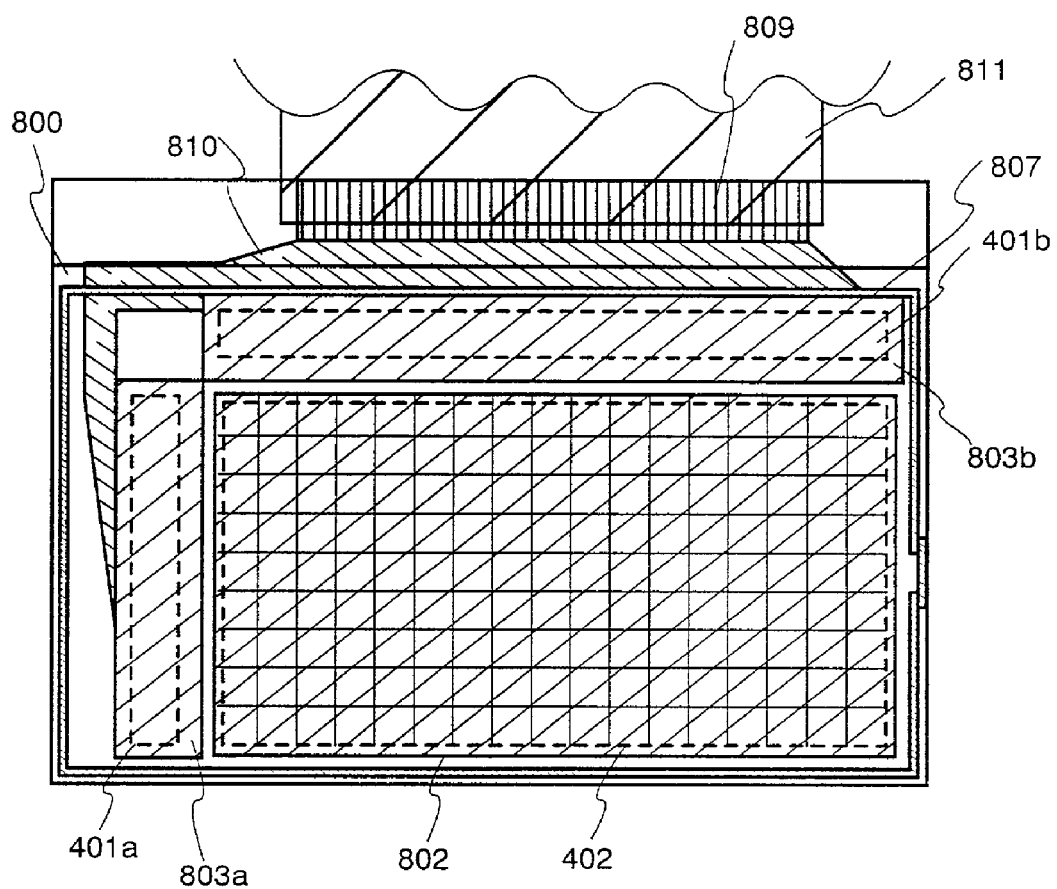
FIG. 13 is a view showing an outside view of a liquid crystal module.

The top view of FIG. 13 shows the state that the active matrix substrate and the opposing substrate 800 are adhering to each other through the sealing member 807. Over the active matrix substrate, an external input terminal 809 to which the pixel portion, the driver circuit, and the FPC (flexible printed circuit) are adhering, a wiring 810 for connecting the external input terminal 809 with an input portion of the respective circuits, and the like are formed.

A light shielding layer 803a is provided in the opposing substrate side so as to overlap with a gate wiring side driver circuit 401a. Also, a light shielding layer 803b is provided in the opposing substrate side so as to overlap with a source wiring side driver circuit 401b. In a color filter 802 which is provided over the opposing substrate side on a pixel portion 402, a light shielding layer and colored layers for respective colors red color (R), green color (G), and blue color (B) are provided corresponding to each pixel. Actually, a color display is formed using three colors, that is, the colored layer for the red color (R), the colored layer for the green color (G), and the colored layer for the blue color (B). Note that the colored layers for respective colors are arbitrarily arranged.

Here, for a color display, the color filter 802 is provided over the opposing substrate. However, the present invention is not particularly limited to this case, and in manufacturing the active matrix substrate, the color filter may be formed over the active matrix substrate.

Also, in the color filter, the light-shielding layer is provided between adjacent pixels such that a portion except for a display region is shielded. The light shielding layers 803a and 803b are provided in a region covering the driver circuit. However, when the liquid crystal display device is incorporated into an electronic device as a display portion thereof, the region covering the driver circuit is covered with a cover. Thus, the color filter may be constructed without the light-shielding layer. In manufacturing the active matrix substrate, the light-shielding layer may be formed over the active matrix substrate.

Also, without providing the light-shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light-shielded.

Also, the FPC 811 which comprises the base film and the wiring is adhering to the external input terminal by using an anisotropic conductive resin. Further, a reinforced plate is provided to increase a mechanical strength.

The liquid crystal module manufactured above can be used as the display portion of various electronic equipments.

This embodiment can be combined with either one of Embodiments 1 to 4.

[Embodiment 6]

Embodiment 1 shows an exemplary reflection type display device in which a pixel electrode is made of a metal material with reflectivity. In this embodiment, an exemplary transmission type display device is shown, in which a pixel electrode is made of a conductive film with light transparency.

The processes up to the process of forming an interlayer insulating film are the same as those in Embodiment 1. Therefore, these processes will be omitted here. After the interlayer insulating film is formed in accordance with Embodiment 1, a pixel electrode made of a conductive film with light transparency is formed. As the conductive film having light transparency, ITO (indium tin oxide alloy), indium zinc oxide alloy ($In_2O_3$—ZnO), zinc oxide (ZnO), or the like may be used.

Thereafter, contact holes are formed in the interlayer insulating film. Then, connection electrodes overlapping the pixel electrodes are formed. The connection electrode is connected to drain regions through contact holes. Furthermore, a source electrode or a drain electrode of another TFT is also formed simultaneously with the connection electrodes.

Herein, an example in which all the driver circuits are formed on a substrate is shown. However, several ICs may be used in a part of a driver circuit.

An active matrix substrate is formed as described above. A liquid crystal module is manufactured in accordance with Embodiment 5, using the active matrix substrate, and a backlight and a light-guiding plate are provided, followed by disposing a cover, whereby an active matrix type liquid crystal display apparatus is completed. The cover and the liquid crystal module are attached to each other with an adhesive or an organic resin. Furthermore, a substrate may be attached to a counter substrate by filling an organic resin between a frame and a substrate so as to surround the frame. Since the apparatus is of a transmission type, polarizing plates are attached to both the active matrix substrate and the counter substrate.

This embodiment can be combined with either one of Embodiments 1 to 4.

[Embodiment 7]

Figure 14A:
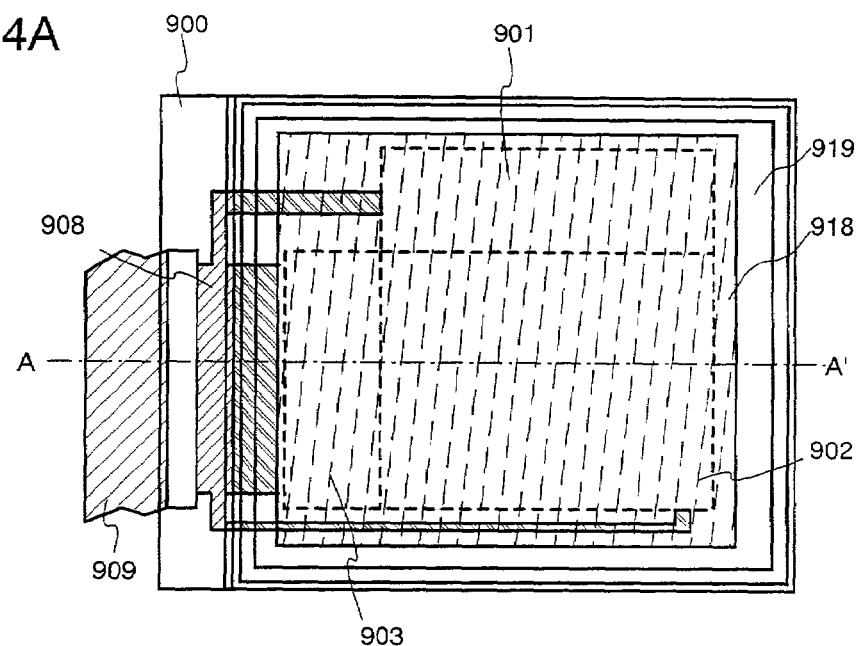
FIGS. 14A and 14B are views showing an EL module in its top and cross section.
Figure 14B:
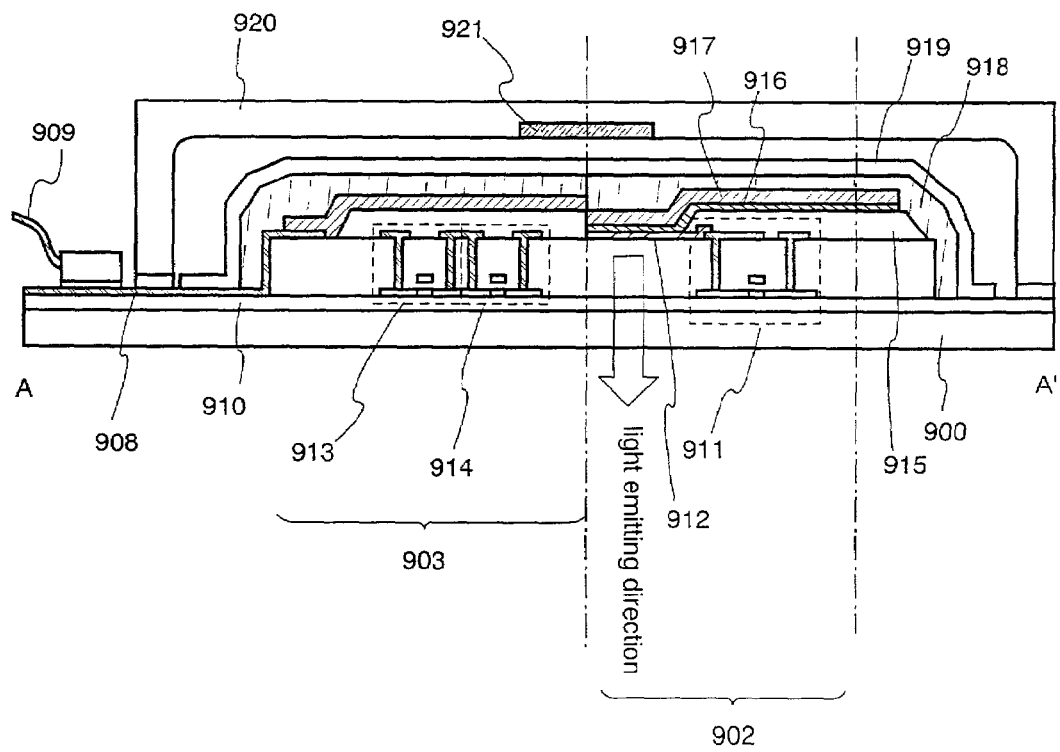

In the present example, FIGS. 14A and 14B show an example of production of a light-emitting display apparatus provided with an electro-luminescence (EL) element.

FIG. 14A is a top view of an EL module, and FIG. 14B is a cross-sectional view taken along a line A–A' in FIG. 14A. A pixel portion 902, a source-side driver circuit 901, and a gate-side driver circuit 903 are formed on a substrate 900 (e.g., a glass substrate, a crystallized glass substrate, a plastic substrate, or the like) having an insulating surface. The pixel portion and driver circuits can be obtained in accordance with the embodiment. Furthermore, reference numerals 918 and 919 denote a sealant and a DLC film, respectively. The pixel portion and the driver circuit portions are covered with the sealant 918, and the sealant 918 is covered with a protective film 919. The layered structure is further sealed with a cover member 920, using an adhesive. The cover member 920 is desirably made of the same material (e.g., glass) as that of the substrate 900 so as to endure deformation due to heat or an external force, and is formed into a concave shape (depth: 3 to 10 μm) shown in FIGS. 14A and 14B by sandblast. It is desirable that the cover member 920 is provided with a concave portion (depth: 50 to 200 μm) for accommodating a drying agent 921. Furthermore, in the case of manufacturing the EL module by multi-chamfering, after the substrate and the cover member are attached to each other, they may be sectioned with a $CO_2$ laser or the like so that the ends thereof are flushed with each other.

Reference numeral 908 denotes wiring for transmitting a signal input to the source-side driver circuit 901 and the gate-side driver circuit 903, which receives a video signal and a clock signal from a flexible printed circuit (FPC) 909 to be an external input terminal. Although only the FPC is shown, the FPC may be provided with a printed wiring board (PWB). A light-emitting device in the present specification includes not only a light-emitting device itself, but also a light-emitting device provided with an FPC or a PWB.

Next, the cross-sectional structure of the EL module will be described with reference to FIG. 14B. An insulating film 910 is formed on the substrate 900, and the pixel portion 902 and the gate-side driver circuit 903 are formed above the insulating film 910. The pixel portion 902 is composed of a plurality of pixels including a current control TFT 911 and a pixel electrode 912 electrically connected to a drain of the current control TFT 911. The gate-side driver circuit 903 is formed of a CMOS circuit in which an n-channel TFT 913 and a p-channel TFT 914 are combined.

The TFTs (including 911, 913, and 914) may be manufactured in accordance with above-mentioned embodiment.

The pixel electrode 912 functions as an anode of an EL element. Banks 915 are formed on both sides of the pixel electrode 912, and an EL layer 916 and a cathode 917 of the EL element are formed on the pixel electrode 912.

The EL layer 916 (for emitting light and allowing carriers to move therefore) may be formed by freely combining a light-emitting layer, a charge transport layer, or a charge injection layer. For example, a low-molecular type organic EL material or a high-molecular type organic EL material may be used. Furthermore, as the EL layer, a thin film made of a light-emitting material (singlet compound) emitting light (fluorescence) by singlet excitation or a thin film made of a light-emitting material (triplet compound) emitting light (phosphorescence) by triple excitation can be used. Furthermore, an inorganic material such as silicon carbide or the like can also be used for a charge transport layer and a charge injection layer. Known materials can be used for the organic EL material and the inorganic material.

The cathode electrode 917 also functions as wiring common to all the pixels, and is electrically connected to the FPC 909 via the connection wiring 908. Furthermore, all the elements included in the pixel portion 902 and the gate-side driver circuit 903 are covered with the cathode 917, the sealant 918, and the protective film 919.

As the sealant 918, it is preferable to use a material that is as transparent or semi-transparent as possible with respect to visible light. Furthermore, the sealant 918 is desirably made of a material that is unlikely to transmit moisture and oxygen.

It is also preferable that, after the light emitting element is completely covered with the sealant 918, the protective film 919 made of a DLC film or the like is provided at least on the surface (exposed surface) of the sealant 918 as shown in FIGS. 14A and 14B. The protective film 919 may be provided over the entire surface of the substrate including its reverse surface. Herein, care should be taken so that the protective film is not formed on a portion where an external input terminal (FPC) is to be provided. The protective film may be prevented from being formed using a mask, or the protective film may be prevented from being formed by covering an external input terminal portion with a tape such as Teflon used as a masking tape by a CVD apparatus.

The EL element is sealed with the sealant 918 and the protective film 919 in the above-mentioned configuration, whereby the EL element can be completely shut off from the outside, and a substance promoting degradation due to oxidation of an EL layer, such as moisture and oxygen, can be prevented from entering from the outside. Thus, a highly reliable light-emitting device can be obtained.

Figure 15:
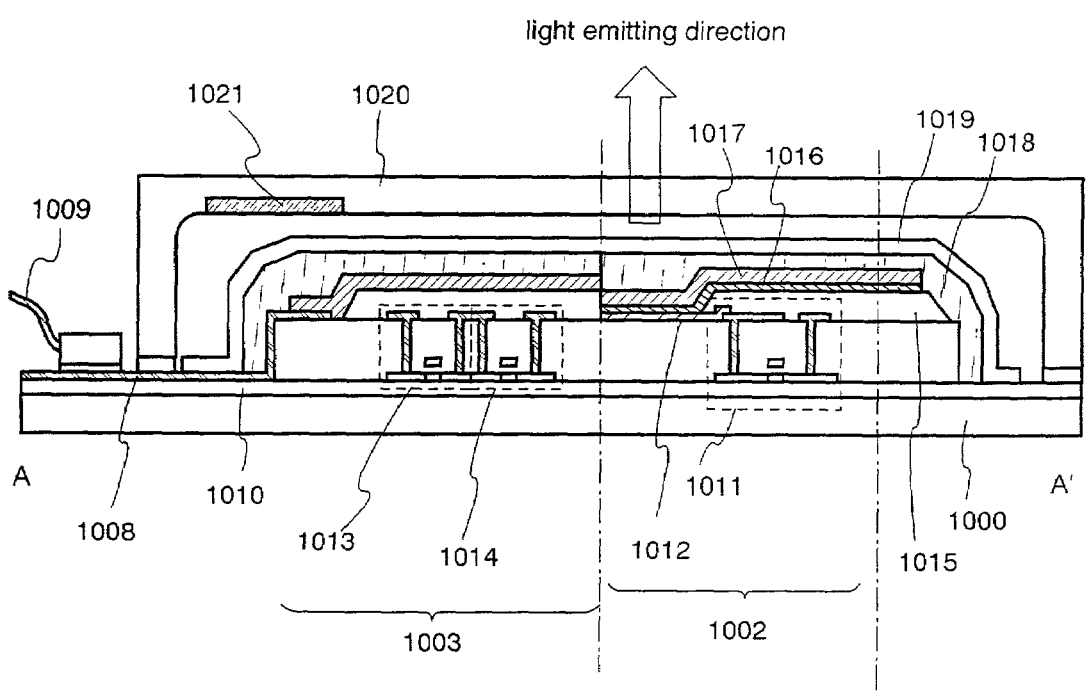
FIG. 15 is a view showing an EL module in its cross section.

It may also be possible to form a pixel electrode as a cathode and stack the EL layer and a positive electrode, thereby obtaining a configuration in which light is emitted in a direction opposite to that in FIGS. 14A and 14B. FIG. 15 shows an example thereof. A top view thereof is the same, so that it will be omitted here.

A cross-sectional structure shown in FIG. 15 will be described below. As a substrate 1000, a semiconductor substrate or a metal substrate, as well as a glass substrate or a quartz substrate can be used. An insulating film 1010 is formed on the substrate 1000. A pixel portion 1002 and a gate-side driver circuit 1003 are formed above the insulating film 1010. The pixel portion 1002 is composed of a plurality of pixels including a current control TFT 1011 and a pixel electrode 1012 electrically connected to a drain of the current control TFT 1011. Furthermore, the gate-side driver circuit 1003 is composed of a CMOS circuit in which an n-channel TFT 1013 and a p-channel TFT 1014 are combined.

The pixel electrode 1012 functions as a cathode of an EL element. Furthermore, banks 1015 are formed on both sides of the pixel electrode 1012, and an EL layer 1016 and an anode 1017 of the EL element are formed on the pixel electrode 1012.

The anode 1017 functions as wiring common to all the pixels, and is electrically connected to an FPC 1009 via connection wiring 1008. Furthermore, all the elements included in the pixel portion 1002 and the gate-side driver circuit 1003 are covered with the anode 1017, the sealant 1018, and the protective film 1019 made of DLC or the like. Furthermore, a cover member and the substrate 1000 are attached to each other with an adhesive. Furthermore, the cover member is provided with a concave portion for accommodating a drying agent 1021.

As the sealant 1018, it is preferable to use a material that is as transparent or semi-transparent as possible with respect to visible light. The sealant 1018 is desirably made of a material that is unlikely to transmit moisture and oxygen.

In FIG. 15, the pixel electrode is formed as a negative electrode, and the EL layer and the positive electrode are stacked. Therefore, a light-emitting direction is as represented by an arrow in FIG. 15.

This embodiment can be combined with either one of Embodiments 1 to 6.

[Embodiment 8]

The driver circuit and the pixel portion formed by implementing the invention can be used in various modules (active matrix type liquid crystal display, active matrix type EL display, active matrix type EC display). That is, the present invention can be implemented in all of electronic devices integrated with the modules at display portions thereof.

As such electronic apparatus, there are pointed out a video camera, a digital camera, a head mount display (goggle type display), a car navigation system, a projector, a car stereo, a personal computer, a portable information terminal (mobile computer, portable telephone or electronic book) and the like. Examples of these are shown in FIG. 16A to 16F, FIG. 17A to 17D and FIG. 18A to 18C.

FIG. 16A shows a personal computer including a main body 2001, an image input portion 2002, a display portion 2003 and a keyboard 2004. The invention is applicable to the display portion 2003.

FIG. 16B shows a video camera including a main body 2101, a display portion 2102, a voice input portion 2103, operation switches 2104, a battery 2105 and an image receiving portion 2106. The invention is applicable to the display portion 2102.

FIG. 16C shows a mobile computer including a main body 2201, a camera portion 2202, an image receiving portion 2203, an operation switch 2204 and a display portion 2205. The invention is applicable the display portion 2205.

FIG. 16D shows a goggle type display including a main body 2301, a display portion 2302 and an arm portion 2303. The invention is applicable to the display portion 2302.

FIG. 16E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet. The invention is applicable to the display portion 2402.

FIG. 16F shows a digital camera including a main body 2501, a display portion 2502, an eye contact portion 2503, operation switches 2504 and an image receiving portion (not illustrated). The invention is applicable to the display portion 2502.

Figure 17A:
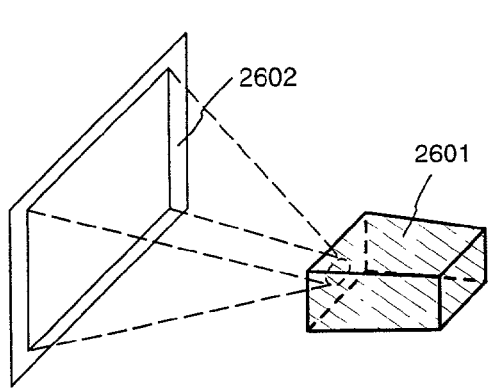
FIGS. 17A to 17D are views showing examples of electronic appliances.

FIG. 17A shows a front type projector including a projection apparatus 2601 and a screen 2602. The invention is applicable to a liquid crystal module 2808 constituting a portion of the projection apparatus 2601.

Figure 17B:
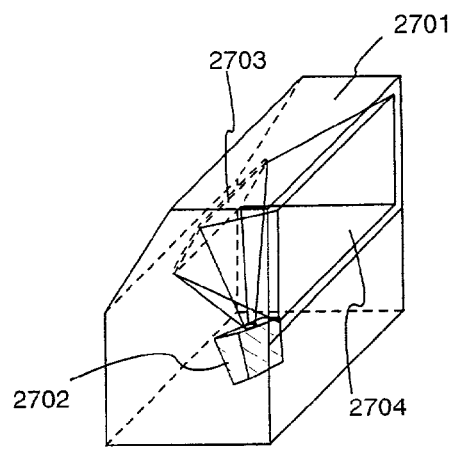

FIG. 17B shows a rear type projector including a main body 2701, a projection apparatus 2702, a mirror 2703 and a screen 2704. The invention is applicable to a liquid crystal module 2808 constituting a portion of the projection apparatus 2702.

Figure 17C:
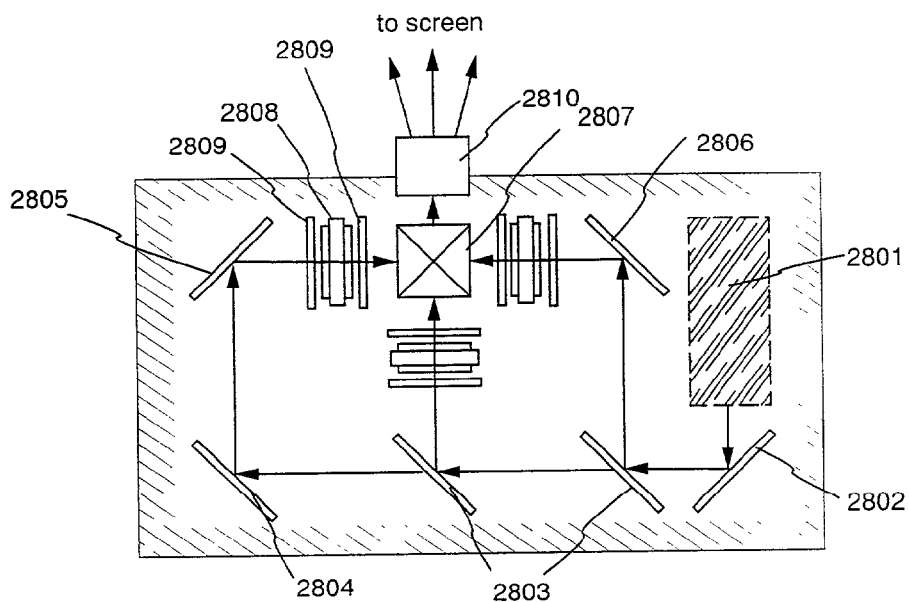

Further, FIG. 17C is a view showing an example of a structure of the projection apparatus 2601 and 2702 in FIG. 17A and FIG. 17B. The projection apparatus 2601 or 2702 is constituted by a light source optical system 2801, mirrors 2802, and 2804 through 2806, a dichroic mirror 2803, a prism 2807, a liquid crystal module 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 17C.

Figure 17D:
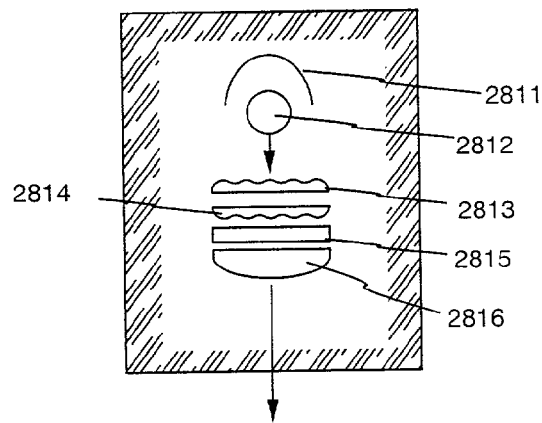

Further, FIG. 17D is a view showing an example of a structure of the light source optical system 2801 in FIG. 17C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 17D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 17A, 17B and 17C, there is shown a case of using a transmission type electronic device and an example of applying a reflection type electronic device and a module is not illustrated.

Figure 18A:
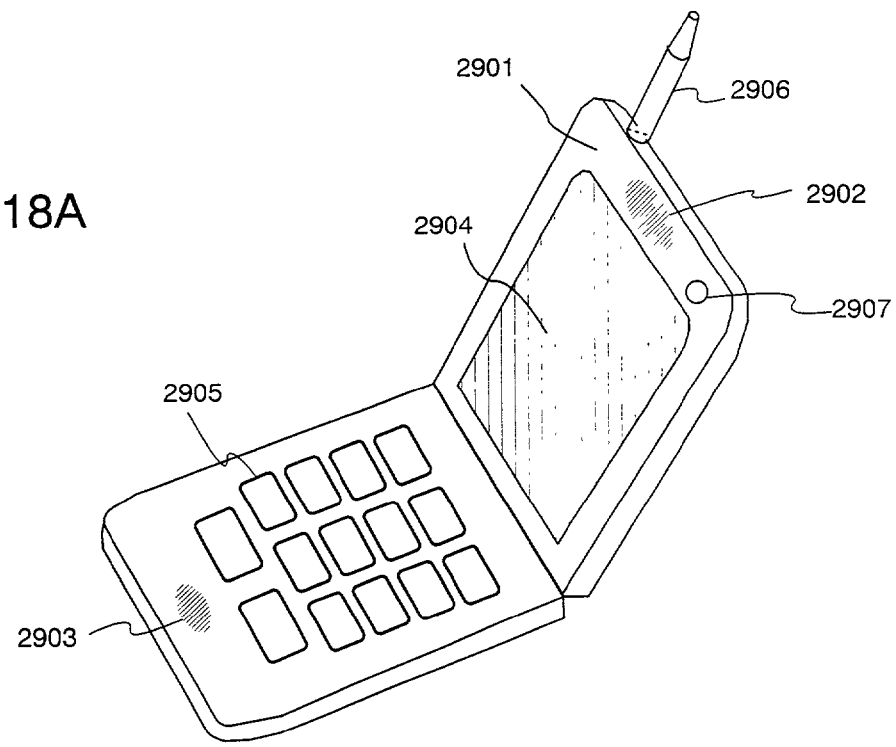
FIGS. 18A to 18C are views showing examples of electronic appliances.

FIG. 18A shows a portable telephone including a main body 2901, a voice output portion 2902, a voice input portion 2903, a display portion 2904, an operation switch 2905, an antenna 2906 and an image input portion (CCD, image sensor, etc) 2907. The invention is applicable to the display portion 2904.

Figure 18B:
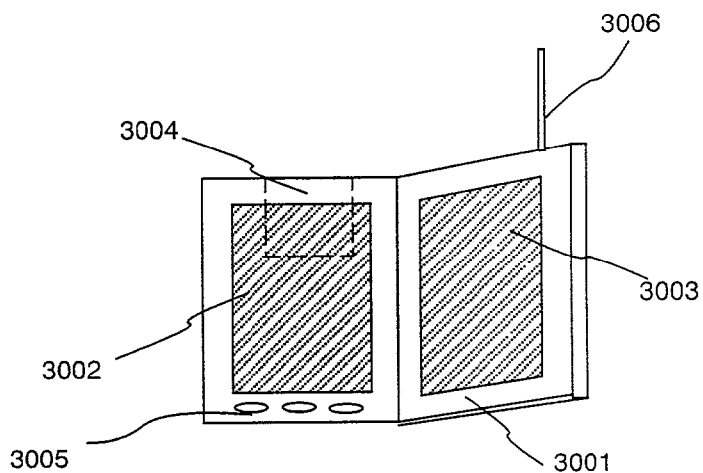

FIG. 18B shows a portable book (electronic book) including a main body 3001, display portions 3002 and 3003, a record medium 3004, an operation switch 3005 and an antenna 3006. The invention is applicable to the display portions 3002 and 3003.

Figure 18C:
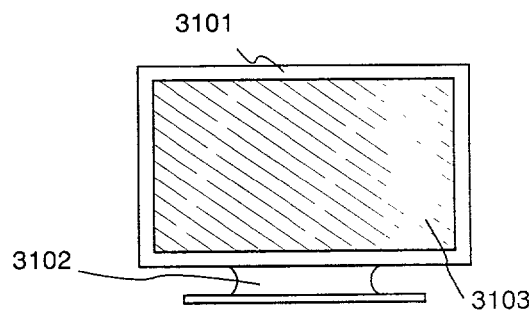

FIG. 18C shows a display including a main body 3101, a support base 3102 and a display portion 3103. The invention is applicable to the display portion 3103.

As has been described, the range of applying the invention is extremely wide and is applicable to electronic device of all the fields. Further, the electronic device of the embodiment can be realized by using any constitution comprising any combinations of Embodiments 1 to 6.

What is claimed is:

1. A semiconductor device comprising:
a semiconductor layer having a crystalline structure on an insulating surface, the semiconductor layer having at least a source region, a drain region and a channel region,
wherein the channel region contains a rare gas element having a concentration gradient, and the channel region has at least a first portion and a second portion, the second portion being more distant from the insulating surface than the first portion, and
wherein a crystallinity of the first portion in the channel region is higher than that of the second portion in the channel region.

2. A semiconductor device according to claim 1, wherein the semiconductor device is a liquid crystal display device.

3. A semiconductor device according to claim 1, wherein the semiconductor device is an EL display device.

4. A semiconductor device according to claim 1, wherein the semiconductor device is at least one selected from the group consisting of a personal computer, a video camera, a mobile computer, a goggle type display, a player using a recording medium, a digital camera, a projector, a portable telephone, and a portable book.

5. A semiconductor device comprising:
a semiconductor layer having a crystalline structure on an insulating surface, the semiconductor layer having at least a source region, a drain region and a channel region,
an insulating film on the semiconductor layer,
wherein the channel region has at least a first portion and a second portion, the second portion contains a rare gas element having a concentration gradient, the second portion being more distant from the insulating surface than the first portion, and
wherein a crystallinity of the first portion in the channel region is higher than that of the second portion in the channel region.

6. A semiconductor device according to claim 5, wherein the semiconductor device is a liquid crystal display device.

7. A semiconductor device according to claim 5, wherein the semiconductor device is an EL display device.

8. A semiconductor device according to claim 5, wherein the semiconductor device is at least one selected from the group consisting of a personal computer, a video camera, a mobile computer, a goggle type display, a player using a recording medium, a digital camera, a projector, a portable telephone, and a portable book.

9. A semiconductor device comprising:
a first semiconductor layer having a crystalline structure on an insulating surface;
a second semiconductor layer on the first semiconductor layer;
a channel region in the first semiconductor layer and the second semiconductor layer;
an insulating film in contact with the second semiconductor layer; and
an electrode in contact with the insulating film,
wherein the channel region in the second semiconductor layer contains a rare gas element having a concentration gradient, and
wherein a crystallinity of the channel region in the first semiconductor layer is higher than that of the channel region in the second semiconductor layer.

10. A semiconductor device according to claim 9, wherein the second semiconductor layer has a crystalline structure.

11. A semiconductor device according to claim 9, wherein the second semiconductor layer has an amorphous structure.

12. A semiconductor device according to claim 9, wherein the semiconductor device is a liquid crystal display device.

13. A semiconductor device according to claim 9, wherein the semiconductor device is an EL display device.

14. A semiconductor device according to claim 9, wherein the semiconductor device is at least one selected from the group consisting of a personal computer, a video camera, a mobile computer, a goggle type display, a player using a recording medium, a digital camera, a projector, a portable telephone, and a portable book.

15. A semiconductor device comprising:
a semiconductor layer having a crystalline structure on an insulating surface, the semiconductor layer having at least a source region, a drain region and a channel region;
a gate insulating film adjacent to the semiconductor layer,
wherein the semiconductor layer contains a rare gas element having a concentration gradient along a direction perpendicular to the insulating surface, and the channel region has at least a first portion and a second portion, the second portion being more distant from the insulating surface than the first portion, and
wherein a crystallinity of the first portion in the semiconductor layer is higher than that of the second portion in the semiconductor layer.

16. A semiconductor device according to claim 15, wherein the semiconductor device is a liquid crystal display device.

17. A semiconductor device according to claim 15, wherein the semiconductor device is an EL display device.

18. A semiconductor device according to claim 15, wherein the semiconductor device is at least one selected from the group consisting of a personal computer, a video camera, a mobile computer, a goggle type display, a player using a recording medium, a digital camera, a projector, a portable telephone, and a portable book.

19. A semiconductor device comprising:
a semiconductor layer having a crystalline structure on an insulating surface, the semiconductor layer having at least a source region, a drain region and a channel region;
a gate insulating film adjacent to the semiconductor layer,
wherein the channel region has at least a first portion and a second portion, wherein the first portion has a higher concentration of the rare gas element than the second portion, wherein the first portion is closer to the gate insulating film than the second portion, and wherein a crystallinity of the second portion is higher than that of the first portion.

20. A semiconductor device according to claim 19, wherein the semiconductor device is a liquid crystal display device.

21. A semiconductor device according to claim 19, wherein the semiconductor device is an EL display device.

22. A semiconductor device according to claim 19, wherein the semiconductor device is at least one selected from the group consisting of a personal computer, a video camera, a mobile computer, a goggle type display, a player using a recording medium, a digital camera, a projector, a portable telephone, and a portable book.

23. A semiconductor device according to claim 1, wherein the lower layer in the channel region comprises poly-silicon and the upper layer in the channel region comprises amorphous silicon.

24. A semiconductor device according to claim 5, wherein the lower layer in the channel region comprises poly-silicon and the upper layer in the channel region comprises amorphous silicon.

25. A semiconductor device according to claim 9, wherein the first semiconductor layer comprises poly-silicon and the second semiconductor layer comprises amorphous silicon.

26. A semiconductor device according to claim 15, wherein the lower layer in the channel region comprises poly-silicon and the upper layer in the channel region comprises amorphous silicon.

27. A semiconductor device comprising:
an electrode over an insulating surface;
an insulating film over the electrode;
a semiconductor layer having at least a source region, a drain region and a channel region over the electrode with the insulating film interposed therebetween,
wherein the channel region contains a rare gas element having a concentration gradient,
wherein the channel region has at least a first portion and a second portion,
wherein the second portion is more distant from the insulating film than the first portion, and
wherein a crystallinity of the first portion in the channel region is higher than that of the second portion in the channel region.

28. A semiconductor device according to claim 27, wherein the semiconductor device is a liquid crystal display device.

29. A semiconductor device according to claim 27, wherein the semiconductor device is an EL display device.

30. A semiconductor device according to claim 27, wherein the semiconductor device is at least one selected from the group consisting of a personal computer, a video camera, a mobile computer, a goggle type display, a player using a recording medium, a digital camera, a projector, a portable telephone, and a portable book.

31. A semiconductor device comprising:
an electrode over an insulating surface;
an insulating film over the electrode;
a semiconductor layer having at least a source region, a drain region and a channel region over the electrode with the insulating film interposed therebetween,
wherein the channel region has at least a first portion and a second portion,
wherein the second portion contains a rare gas element having a concentration gradient,
wherein the second portion is more distant from the insulating film than the first portion, and
wherein a crystallinity of the first portion in the channel region is higher than that of the second portion in the channel region.

32. A semiconductor device according to claim 31, wherein the semiconductor device is a liquid crystal display device.

33. A semiconductor device according to claim 31, wherein the semiconductor device is an EL display device.

34. A semiconductor device according to claim 31, wherein the semiconductor device is at least one selected from the group consisting of a personal computer, a video camera, a mobile computer, a goggle type display, a player using a recording medium, a digital camera, a projector, a portable telephone, and a portable book.

35. A semiconductor device comprising:
an electrode over an insulating surface;
an insulating film over the electrode;
a first semiconductor layer over the electrode with the insulating film interposed therebetween;
a second semiconductor layer over the first semiconductor layer; and
a channel region in the first semiconductor layer and the second semiconductor layer,
wherein the channel region in the second semiconductor layer contains a rare gas element having a concentration gradient, and
wherein a crystallinity of the channel region in the first semiconductor layer is higher than that of the channel region in the second semiconductor layer.

36. A semiconductor device according to claim 35, wherein the semiconductor device is a liquid crystal display device.

37. A semiconductor device according to claim 35, wherein the semiconductor device is an EL display device.

38. A semiconductor device according to claim 35, wherein the semiconductor device is at least one selected from the group consisting of a personal computer, a video camera, a mobile computer, a goggle type display, a player using a recording medium, a digital camera, a projector, a portable telephone, and a portable book.

* * * * *